United States Patent [19]

Satoh et al.

[11] Patent Number: 5,754,062

[45] Date of Patent: May 19, 1998

[54] CURRENT SWITCHING LOGIC TYPE CIRCUIT WITH SMALL CURRENT CONSUMPTION

[75] Inventors: Hisayasu Satoh; Kimio Ueda; Nagisa Sasaki, all of Hyogo, Japan

[73] Assignee: Mitsubishi Denki Kabushiki Kaisha, Tokyo, Japan

[21] Appl. No.: 735,834

[22] Filed: Oct. 23, 1996

Related U.S. Application Data

[62] Division of Ser. No. 399,289, Mar. 6, 1995, Pat. No. 5,602,498.

[30] Foreign Application Priority Data

Mar. 15, 1994 [JP] Japan .................................. 6-43644
Dec. 16, 1994 [JP] Japan ................................ 6-313008

[51] Int. Cl.$^6$ .................. H03K 19/086; H03K 19/01
[52] U.S. Cl. .................. 326/126; 326/18; 326/26; 327/202
[58] Field of Search .................. 326/126, 127, 326/18, 26; 327/202

[56] References Cited

U.S. PATENT DOCUMENTS

| | | | |
|---|---|---|---|
| 4,289,978 | 9/1981 | Konian et al. | 326/126 |
| 4,748,346 | 5/1988 | Emori | 326/126 |
| 4,810,908 | 3/1989 | Suzuki et al. | 326/126 |
| 4,877,977 | 10/1989 | Kokado | 326/126 |
| 4,926,071 | 5/1990 | MacMillan et al. | 326/57 |
| 5,001,361 | 3/1991 | Tamamura et al. | 327/202 |
| 5,338,980 | 8/1994 | Ovens | 326/126 |

FOREIGN PATENT DOCUMENTS

| | | |
|---|---|---|
| 3 135 952 | 4/1983 | Germany . |
| 61-281620 | 12/1986 | Japan . |
| 64-24628 | 1/1989 | Japan . |
| 1-101022 | 4/1989 | Japan . |
| 3-128526 | 5/1991 | Japan . |
| 4-119011 | 4/1992 | Japan . |
| 4-364607 | 12/1992 | Japan . |
| 5-7152 | 1/1993 | Japan . |
| 5-37353 | 2/1993 | Japan .......................... 326/126 |
| 5-308276 | 11/1993 | Japan . |

OTHER PUBLICATIONS

"High Speed Digital Circuits", Kai-Yap Toh et al., International Solid State Circuits Conference '89, pp. 224-225.
"A 23-PS/2.1-M W ECL Gate with an AC-Coupled Active Pull-Down Emitter-Follower Stage", Kai-Yap Toh et al., IEEE Journal of Solid-State Circuits, vol. 24, No. 5, Oct. 1989, pp. 1301-1306.

*Primary Examiner*—Edward P. Westin
*Assistant Examiner*—Benjamin D. Driscoll
*Attorney, Agent, or Firm*—McDermott, Will & Emery

[57] ABSTRACT

First emitters of a pair of input multi-emitter transistors are connected to a current source in common, to form an input differential amplifier. The other emitters of the input multi-emitter transistors are connected to current sources respectively. Pull-up and pull-down transistors are provided for respective ones of a pair of output terminals. Bases of the pull-up transistors are supplied with collector voltages of the input multi-emitter transistors, while those of the pull-down transistors are supplied with voltages of the other emitters of the multi-emitter transistors. Provided is an emitter-coupled logic circuit which has excellent load drivability, operates stably and obtains complementary outputs at a low cost.

5 Claims, 13 Drawing Sheets

5,754,062

CURRENT SWITCHING LOGIC TYPE CIRCUIT WITH SMALL CURRENT CONSUMPTION

This application is a division of application Ser. No. 08/399,289 filed Mar. 6, 1995, now U.S. Pat. No. 5,602,498.

BACKGROUND OF THE INVENTION

1. Field of the Invention

The present invention relates to a current switching type logic circuit such as an emitter-coupled logic circuit, a source-coupled logic circuit or a current mode logic circuit.

2. Description of the Background Art

FIG. 17 is a circuit diagram showing the structure of a conventional emitter-coupled logic circuit 31. Referring to FIG. 17, this emitter-coupled logic circuit 31 includes an input terminal Vi1, a reference potential terminal Vbb1, first and second output terminals Vo1 and Vo2, and first and second power supply terminals Vcc and Vee. A binary logic signal having logical high and low levels is inputted in the input terminal Vi1. A voltage providing a threshold value of the logic of the input logic signal is applied to the reference potential terminal Vbb1. A first power supply potential as one operation power supply potential is applied to the first power supply terminal Vcc, while a second power supply potential, as another operation power supply potential, which is lower than the first power supply potential is applied to the second power supply terminal Vee. Load capacitances such as the input capacitance of a next stage gate and an interconnection line capacitances are associated with the first and second output terminals Vo1 and Vo2.

The emitter-coupled logic circuit 31 further includes a current switching circuit 31a and an emitter-follower circuit 31b. The current switching circuit 31a includes an input transistor Q31, a reference transistor Q32, resistances R31 and R32, and a current source I31. The transistors Q31 and Q32 have bases which are connected to the input terminal Vi1 and the reference potential terminal Vbb1 respectively, collectors which are connected to the first power supply terminal Vcc through the resistances R31 and R32 respectively, and emitters which are connected together to the second power supply terminal Vee through the current source I31.

The emitter-follower circuit 31b includes pull-up transistors Q33 and Q34 and current sources I32 and I33. The pull-up transistors Q33 and Q34 have bases which are connected to the collectors of the transistors Q31 and Q32 respectively, collectors which are connected to the first power supply terminal Vcc, and emitters which are connected to the first and second output terminals Vo1 and Vo2 respectively as well as to the second power supply terminal Vee through the current sources I32 and I33 respectively.

The operation is now described. When the input logic signal is changed from a logical low level to a logical high level, the transistors Q31 and Q32 enter conducting and cutoff states respectively. Therefore, most of a switching current Is of the current source I31 flows in the resistance R31 through the transistor Q31. The base potential of the transistor Q33 is reduced by a voltage drop in the resistance R31, so that the transistor Q33 enters a cutoff, or a weak off state. On the other hand, the collector voltage of the transistor Q32, i.e., the base voltage of the transistor Q34 is increased substantially up to the potential of the first power supply terminal Vcc, whereby the transistor Q34 enters a conducting state. Thus, charges of the load capacitance which is connected to the output terminal Vo1 are extracted by the current source I32, whereby the voltage of the output terminal Vo1 is changed from a logical high level to a logical low level. On the other hand, the load capacitance which is connected to the output terminal Vo2 is charged through the transistor Q34, whereby the voltage of the output terminal Vo2 is changed from a logical low level to a logical high level.

In this emitter-coupled logic circuit 31, the speed of response is decreased by the load capacitances. In order to attain a speed increase, therefore, it is necessary to increase emitter-follower currents Ie1 and Ie2 flowing in the current sources I32 and I33, and hence power consumption is disadvantageously increased. Further, the emitter-follower currents Ie1 and Ie2 continuously flow when the outputs remain unchanged, leading to inferior current efficiency.

Such disadvantages may be overcome by a circuit which is described in ISSCC (International Solid State Circuits Conference) '89, pp. 224–225, for example. FIG. 18 is a circuit diagram showing the structure of an emitter-coupled logic circuit 32 which is described in this article. Referring to FIG. 18, this emitter-coupled logic circuit 32 includes an input terminal Vi1, a reference potential terminal Vbb1, an output terminal Vo1 and first and second power supply terminals Vcc and Vee. The emitter-coupled logic circuit 32 further includes a current switching circuit 31a which is identical in structure to that shown in FIG. 17, and an emitter-follower circuit 32b.

The emitter-follower circuit 32b includes a capacitive element C31, diodes D31 and D32, a current source I34, a pull-up transistor Q33, a pull-down transistor Q35, and a resistance 33. The diodes D31 and D32 and the current source I34 are connected in series between the first and second power supply terminals Vcc and Vee, to form a bias circuit. The capacitive element C31 is connected between the collector of a reference transistor Q32 and a node N31. The pull-up transistor Q33 has a base which is connected to the collector of an input transistor Q31, a collector which is connected to the first power supply terminal Vcc, and an emitter which is connected to the output terminal Vo1. The pull-down transistor Q35 has a base which is connected to the node N31, a collector which is connected to the output terminal Vo1, and an emitter which is connected to the second power supply terminal Vee through the resistance R33.

The operation is now described. When an input logic signal is changed from a logical low level to a logical high level, the transistors Q31 and Q32 enter conducting and cutoff states respectively. Therefore, most of a switching current Is flows in a resistance R31 through the transistor Q31, and the base potential of the pull-up transistor Q33 is reduced due to a voltage drop by the resistance R31 so that the pull-up transistor Q33 enters a cutoff state. On the other hand, the collector voltage of the transistor Q32 is increased substantially up to the potential of the first power supply terminal Vcc and the base potential of the pull-down transistor Q35 is increased through capacitive coupling by the capacitive element C31, whereby an emitter-follower current Ie1 is increased. Thus, charges of a load capacitance CL1 which is connected to the output terminal Vo1 are rapidly extracted and a signal at the output terminal Vo1 is changed from a logical high level to a logical low level.

In this emitter-coupled logic circuit 32, the emitter-follower current Ie1 is set at a small value when the logical level of the input logic signal remains unchanged while the emitter-follower current Ie1 is increased only when the logical level of the input logic signal is changed to fall the output signal. Thus, it may be possible to reduce power consumption while maintaining a high-speed operation.

However, it is necessary to change the potential of the node N31 at a high speed by the capacitive coupling of the capacitive element C31. In this case, the capacitive element C31 requires a capacitance value of about several pF, resulting in increase in area, and the number of steps for formation of the capacitive element C31 is increased. Further, only one of inverted and non-inverted outputs can be taken out and hence it is impossible to accommodate complementary signal outputs.

An exemplary emitter-coupled logic circuit which can provide complementary outputs is illustrated in FIG. 5(b) of Japanese Patent Laying-Open No. 4-364607 (1992). FIG. 19 is a circuit diagram showing the structure of an emitter-coupled logic circuit 33 shown in this document. Referring to FIG. 19, this emitter-coupled logic circuit 33 includes an input terminal Vi1, first and second reference potential terminals Vbb1 and Vbb2, first and second output terminals Vo1 and Vo2, and first and second power supply terminals Vcc and Vee. An input threshold voltage for a pull-down transistor Q35 is applied to the second reference potential terminal Vbb2. The emitter-coupled logic circuit 33 further includes a current switching circuit 31a which is identical in structure to that shown in FIG. 17, and an emitter-follower circuit 33b.

The emitter-follower circuit 33b includes pull-up transistors Q33 and Q34, pull-down transistors Q35 and Q36, and a current source I35. The pull-up transistors Q33 and Q34 have bases which are connected to collectors of transistors Q31 and Q32 respectively, collectors which are connected to the first power supply terminal Vcc, and emitters which are connected to the first and second output terminals Vo1 and Vo2 respectively. The pull-down transistors Q35 and Q36 have bases which are connected to emitters of the transistors Q31 and Q32 and the second reference potential terminal Vbb respectively, collectors which are connected to the first and second output terminals Vo1 and Vo2 respectively, and emitters which are connected together to the second power supply terminal Vee through the current source I35.

When an input logic signal Vi1 is changed from a logical low level to a logical high level, the base potential of the pull-up transistor Q33 drops and that of the pull-up transistor Q34 is increased as hereinabove described. The base potential of the pull-down transistor Q35 is increased following the signal supplied to the input terminal Vi1 by an emitter-follower operation of the transistor Q31. Therefore, the pull-up transistor Q33 enters a cutoff state and the pull-down transistor Q35 enters a conducting state, whereby a signal at the first output terminal Vo1 is changed from a logical high level to a logical low level. Further, the pull-up transistor Q34 enters a conducting state and the pull-down transistor Q36 enters a cutoff state, whereby a signal at the second output terminal Vo2 is changed from a logical low level to a logical high level.

This emitter-coupled logic circuit 33 has such disadvantages that the second reference potential terminal Vbb2 is additionally required and the amplitude of the potential which is applied to the base of the pull-down transistor Q35 is substantially halved as compared with the logic amplitude of the input logic signal since a logical high level thereof is Vi1(H)—VBE and a logical low level thereof is Vbb1—VBE, where Vi1(H) represents a logical high level voltage of the input logic signal at the terminal Vi1 and VBE represents the base-to-emitter voltage of the transistors Q31 and Q32.

Another exemplary conventional circuit which can provide complementary outputs is described in Japanese Patent Publication No. 1-54890 (1989). FIG. 20 is a circuit diagram showing the structure of an emitter-coupled logic circuit 34 which is described in this document. Referring to FIG. 20, this emitter-coupled logic circuit 34 includes an input terminal Vi1, a first reference potential terminal Vbb1, an output terminal Vo1, and first and second power supply terminals Vcc and Vee. Further, the emitter-coupled logic circuit 34 includes a current switching circuit 31a which is identical in structure to that shown in FIG. 17, and an emitter-follower circuit 34b.

The emitter-follower circuit 34b includes an NPN multi-emitter transistor Q37 having first and second emitters, a Schottky diode SD31, a resistance R34 and a PNP transistor QP31. The multi-emitter transistor Q37 has a base which is connected to the collector of a transistor Q31, a collector which is connected to the first power supply terminal Vcc, the first emitter which is connected to the second power supply terminal Vee through the Schottky diode SD31 and the resistance R34, and the second emitter which is connected to the output terminal Vo1. The PNP transistor QP31 has a base which is connected to a node between the Schottky diode SD31 and the resistance R34, an emitter which is connected to the output terminal Vo1, and a collector which is connected to the second power supply terminal Vee.

The operation is now described. When an input logic signal is at a logical low level and the transistor Q31 is in a cutoff state and transistors Q32 and Q37 are responsively in conducting states respectively, a voltage which is applied across the Schottky diode SD1 is smaller than the base-to-emitter voltage of the PNP transistor QP31, whereby the PNP transistor QP31 is in a cutoff state. Therefore, a load capacitance CL1 is charged through the multi-emitter transistor Q37, and the potential at the output terminal Vo1 attains a logical high level.

When the input logic signal is changed from the logical low level to a logical high level and responsively the transistor Q31 enters a conducting state and the transistors Q32 and Q37 enter cutoff states, the sum of the voltage across the first and second emitters of the multi-emitter transistor Q37 and that applied across the Schottky diode SD31 exceeds the base-to-emitter voltage of the PNP transistor QP31, whereby the PNP transistor QP31 enters a conducting state. Therefore, charges of the load capacitance CL1 are rapidly discharged through the PNP transistor QP31, and a voltage at the output terminal Vo1 is changed to a logical low level.

In this emitter-coupled logic circuit 34, the high-speed PNP transistor QP31 of a different conductivity type is required and hence the manufacturing process cost is increased. In addition the Schottky diode SD31 which is different from a PN diode is required and hence the process is complicated and the manufacturing cost is increased.

SUMMARY OF THE INVENTION

An object of the present invention is to provide a current switching logic circuit of low power consumption, excellent load drivability and operation stability, and a low cost.

Another object of the present invention is to provide a current switching logic circuit which can provide complementary outputs.

A current switching logic circuit according to a first aspect of the present invention includes a current switching stage including first and second multi-node transistors each having first and second one-side conduction nodes, and first, second and third current sources. In the current switching stage, the first and second multi-node transistors have control electrode nodes which are connected to first and second input nodes respectively receiving signals of complementary logics, another-side conduction nodes which are coupled together to receive a voltage of a first power supply node, the first one-side conduction nodes which are connected to a second power supply node through the first and second current sources respectively, and the second one-side conduction nodes which are coupled to the second power supply node in common through the third current source.

The current switching logic circuit according to the first aspect further includes an output drive stage including first to fourth output drive transistors. In this output drive stage, the first and second output drive transistors have control electrode nodes which are connected to the other-side conduction nodes of the first and second multi-node transistors respectively, another-side conduction nodes which are connected together to receive the voltage of the first power supply node in common, and one-side conduction nodes which are connected to first and second output nodes respectively. The third and fourth output drive transistors have control electrode nodes which are connected to the first one-side conduction nodes of the first and second multi-node transistors respectively, one-side conduction nodes which are connected together to receive the voltage of the second power supply node in common, and another-side conduction nodes which are connected to the first and second output nodes respectively.

A current switching logic circuit according to a second aspect of the present invention includes a first current source which is coupled to a second power source supplying an operation power supply potential, a pair of differential transistors having one-side conduction nodes which are connected together and coupled to the first current source, control electrode nodes which are connected respectively to receive input signals of complementary logics, and another-side conduction nodes outputting internal signals of complementary logics in accordance with the input signals, a first output drive transistor which drives a first output node to a first logical level in response to one of the complementary internal signals from the pair of differential transistors, a second output drive transistor which complementarily conducts to the first output drive transistor in response to the other internal signal for driving a second output node to the first logical level, a second current source which is coupled to the second power source, a third output drive transistor which complementarily conducts to the first output drive transistor in response to one of the input signals for coupling the second current source with the first output node and driving the first output node to a second logical level, a fourth output drive transistor which complementarily conducts to the second and third output drive transistors in response to the other input signal for coupling the second current source with the second output node and driving the second output node to the second logical level, and output current control means having smaller current drivability than that of the second current source, which is coupled between the first and second output nodes and the second power source.

In the current switching logic circuit according to the first aspect of the present invention, the first multi-node transistor outputs a first complementary internal logic signal pair from the other-side conduction node and the first one-side conducting node thereof, for driving the first and third output drive transistors. The second multi-node transistor outputs a second complementary internal logic signal pair from the other-side conduction node and the first one-side conduction node thereof, for driving the second and fourth output drive transistors. The second one-side conduction nodes of the first and second multi-node transistors are connected together to form a differential amplifier. Thus, it is possible to take out complementary outputs. In each of the complementary output nodes, an emitter (source)-follower current is reduced when its output is changed from a logical low level to a logical high level, while it is increased when the output is changed from a logical high level to a logical low level. Thus, it is possible to improve load drivability without increasing power consumption. Further, potentials which are applied to the control electrode nodes of the third and fourth output drive transistors are substantially equal in logic amplitudes to the input signals, whereby the circuit stably operates without increasing the input capacitances. Further, this circuit requires no special elements such as a capacitive element for capacitive coupling and a Schottky diode, whereby the wafer process is not complicated and the manufacturing cost is not increased.

In the current switching logic circuit according to the second aspect, the third and fourth output drive transistors form a current switching type differential amplifier and they complementarily conduct respectively to the first and second output drive transistors in response to the input signals of complementary logics for driving the first and second output nodes. Thus, the third and fourth output drive transistors stably operate in response to the signals of sufficient logic amplitudes while only one of them is in a conducting state, whereby it is possible to reduce current consumption. Further, the first and second output nodes are driven by the first to fourth output drive transistors in a push-pull-like mode, whereby it is possible to drive output loads at a high speed with low current consumption. Even if the first or second output drive transistor conducts to drive the first or second output node to the first logical level by the current control means, a small current flows to an output drive transistor to be brought into a conducting state, whereby it is possible to prevent the first and second output drive transistors from entering cutoff states together as well as to prevent increase in output impedance, thereby guaranteeing a stable and high speed operation.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiment 1

Figure 1:
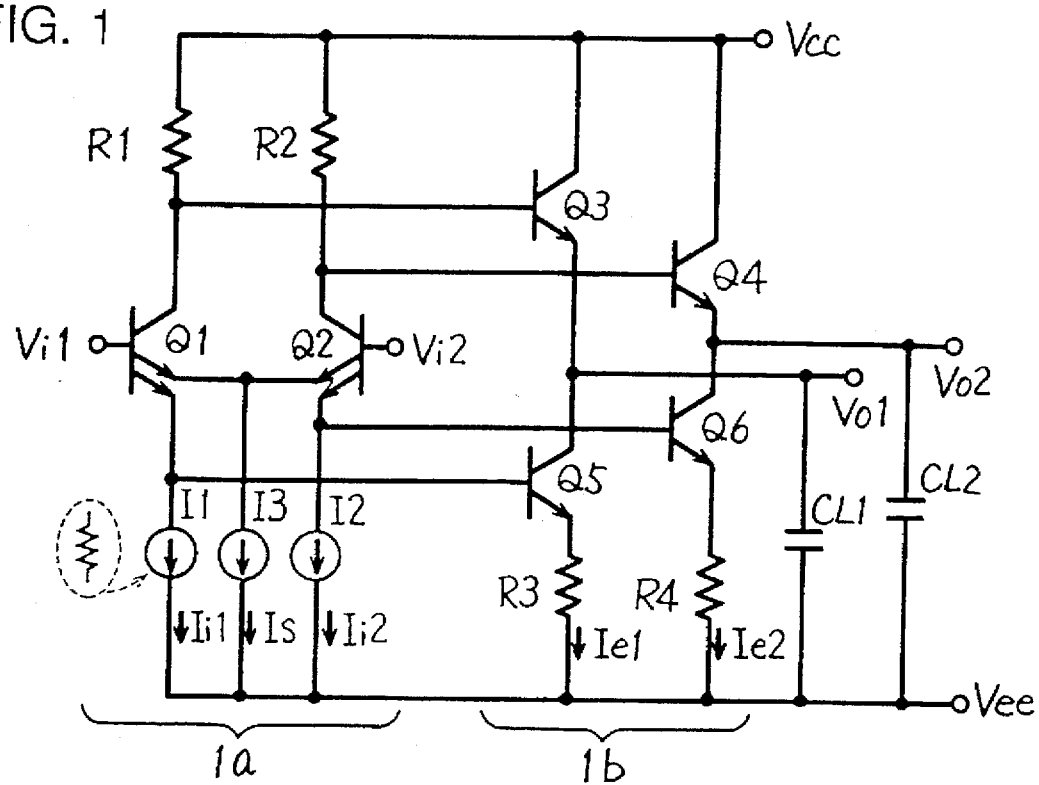
FIG. 1 is a circuit diagram showing the structure of an emitter-coupled logic circuit according to a first embodiment of the present invention.

FIG. 1 is a circuit diagram showing the structure of an emitter-coupled logic circuit 1 according to a first embodiment of the present invention. Referring to FIG. 1, the emitter-coupled logic circuit 1 includes first and second input terminals Vi1 and Vi2, first and second output terminals Vo1 and Vo2, and first and second power supply terminals Vcc and Vee. Logic signals which are complementary with each other are inputted at the first and second input terminals Vi1 and Vi2 respectively. The emitter-coupled logic circuit 1 further includes a current switching circuit 1a and an emitter-follower circuit 1b.

The current switching circuit 1a includes NPN multi-emitter transistors Q1 and Q2 serving respectively as first and second multi-node transistors each having emitters serving as first and second one-side conduction nodes, first and second resistances R1 and R2, and first, second and third current sources I1, I2 and I3. The first and second multi-emitter transistors Q1 and Q2 have bases (control electrode nodes) which are connected to the first and second input terminals Vi1 and Vi2 respectively, and collectors (other-side conduction nodes) which are connected to the first power supply terminal Vcc supplying one operation power supply potential through the resistances R1 and R2 respectively. The first emitters of the first and second multi-emitter transistors Q1 and Q2 are connected to the second power supply terminal Vee supplying another operation power supply potential through the first and second current sources I1 and I2 respectively, while the second emitters are connected together to the second power supply terminal Vee through the third current source I3.

The emitter-follower circuit 1b includes NPN pull-up transistors Q3 and Q4 serving as first and second output drive transistors respectively, first and second NPN pull-down transistors (third and fourth output drive transistors) Q5 and Q6, and resistances R3 and R4. The first and second pull-up transistors Q3 and Q4 have bases which are connected to the collectors of the first and second multi-emitter transistors Q1 and Q2 respectively, collectors which are connected to the first power supply terminal Vcc, and emitters which are connected to the first and second output terminals Vo1 and Vo2 respectively. The first and second pull-down transistors Q5 and Q6 have bases which are connected to the first emitters of the first and second multi-emitter transistors Q1 and Q2 respectively, collectors which are connected to the first and second output terminals Vo1 and Vo2 respectively, and emitters which are connected to the second power supply terminal Vee through the resistances R3 and R4 respectively. Load capacitances CL1 and CL2 such as an interconnection line capacitance and an input capacitance of a next stage gate are associated with the output terminals Vo1 and Vo2.

The operation is now described. When the logic signal which is inputted at the input terminal Vi1 is changed from a logical low level to a logical high level, the logic signal which is inputted at the input terminal Vi2 is changed from a logical high level to a logical low level. At this time, the multi-emitter transistors Q1 and Q2 enter a conducting state and a cutoff state respectively. Most of a switching current Is of the current source I3 flows through the multi-emitter transistor Q1 and the resistance R1. The base potential of the pull-up transistor Q3 is reduced due to a voltage drop by the resistance R1, whereby the pull-up transistor Q3 enters a cutoff state. Further, the base potential of the pull-down transistor Q5 is increased in accordance with the logic signal which is supplied to the input terminal Vi1, whereby an emitter-follower current Ie1 flowing through the resistance R3 is increased. Thus, charges are rapidly extracted from the load capacitance CL1 which is connected to the output terminal Vo1, whereby the potential at the output terminal Vo1 is rapidly changed from a logical high level to a logical low level.

The pull-up transistor Q4, whose base potential substantially reaches the power supply voltage level at the power supply terminal Vcc, conducts since substantially no voltage drop is developed across the resistance R2 (the switching current Is is sufficiently larger than currents Ii1 and Ii2). On the other hand, the base potential of the pull-down transistor Q6 is reduced following the logic signal which is supplied to the input terminal Vi2, whereby an emitter-follower current Ie2 flowing through the resistance R4 is reduced, most of an emitter current of the pull-up transistor Q4 is used for charging the load capacitance CL2, and the output terminal Vo2 is rapidly changed from a logical low level to a logical high level.

When the logic signal inputted at the input terminal Vi1 is changed from a logical high level to a logical low level, the operations of the transistors Q3 to Q6 have only to be reversed to those in the above description.

As hereinabove described, the emitter-follower current is reduced when the output signal is changed from a logical low level to a logical high level while the emitter-follower current is increased when the output signal is changed from a logical high level to a logical low level with respect to an output terminal in the emitter-coupled logic circuit 1 according to this embodiment, whereby it is possible to attain improvement in load drivability. Further, it is possible to reduce power consumption since the emitter-follower current as a whole can be reduced.

In addition, the input logic signals are transmitted to the bases of the pull-down transistors Q5 and Q6 by emitter-follower operations of the multi-emitter transistors Q1 and Q2, whereby the pull-down transistors Q5 and Q6 stably operate since base voltage amplitudes thereof are substantially equal to the amplitudes of the input logic signals. Thus, it is possible to stabilize the circuit operation without increasing the input capacitances. Further, it is possible to enhance the effects of improving load drivability and reducing power consumption due to capability of changing the emitter-follower currents to a greater extent.

Further, dissimilarly to the prior art, the circuit can be structured only by NPN bipolar transistors and resistances with no requirement for special elements such as the capacitive element C31 for capacitive coupling, the PNP transistor QP31 and the Schottky diode SD31, whereby the wafer process is not complicated and the manufacturing cost is not increased.

In addition, it is possible to advantageously take out complementary output signals. The pull-down transistors Q5 and Q6 provide high speed response since the input logic signals are supplied to the bases thereof through the first emitters of the multi-emitter transistors Q1 and Q2 respectively, and no reference potential Vbb2 is necessary.

Due to the employment of the multi-emitter transistors Q1 and Q2, further, it is not necessary to directly supply the input logic signals to the bases of the pull-down transistors Q5 and Q6, whereby increase of the input capacitances can be suppressed. The current values of the current sources I1 and I2, which are adapted to only drive input capacitances (base capacitances) of the pull-down transistors Q5 and Q6, can be set at sufficiently small levels as compared with the switching current Is and the emitter-follower currents Ie1 and Ie2. Thus, increase of power consumption is very small. On the other hand, the currents Ii1 and Ii2 flows through the transistors Q1 and Q2 by the current sources I1 and I2 respectively, whereby each of logical high and low levels of the collector voltages of the transistors Q1 and Q2 drops from the voltage of the first power supply terminal Vcc by R1×Ii1 and R2×Ii1 respectively. The transistors Q3 and Q4 operate in emitter-follower modes, whereby the voltage levels of the output terminals Vo1 and Vo2 are decided by the base voltages of the transistors Q3 and Q4. Thus, high and logical low levels of output signals from the output terminals Vo1 and Vo2 are similarly reduced, so that the circuit 1 shown in FIG. 1 can also serve as a level shifting circuit.

The current sources I1 and I2 can simply be formed by resistances. In this case, the number of elements is not increased as compared with the conventional emitter-coupled logic circuit.

Embodiment 2

Figure 2:
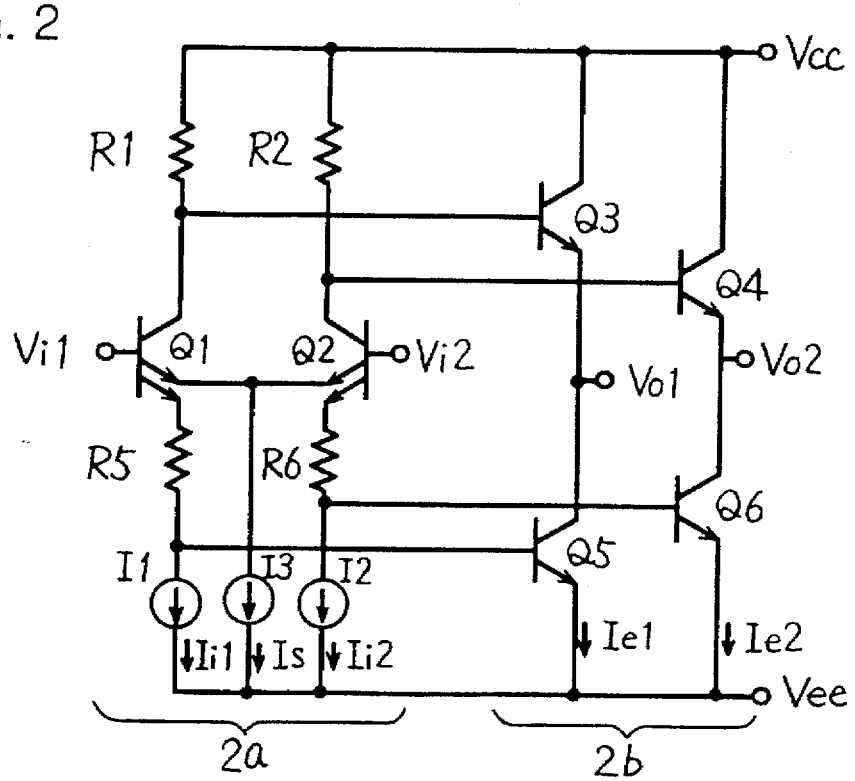
FIG. 2 is a circuit diagram showing the structure of an emitter-coupled logic circuit according to a second embodiment of the present invention.

FIG. 2 is a circuit diagram showing the structure of an emitter-coupled logic circuit 2 according to a second embodiment of the present invention. The emitter-coupled logic circuit 2 shown in FIG. 2 is different from that of FIG. 1 in the points that fifth and sixth resistances R5 and R6 are inserted between first emitters of multi-emitter transistors Q1 and Q2 and first and second current sources I1 and I2 respectively, and emitters of first and second pull-down transistors Q5 and Q6 are directly connected to receive a second power supply terminal Vee.

The basic operation of this emitter-coupled logic circuit 2 is substantially identical to that of the first embodiment, and hence repeated description is omitted and only a different point is described. According to the first embodiment, potentials which are lower than the input potentials supplied to the input terminals Vi1 and Vi2 by base-to-emitter voltages of the multi-emitter transistors Q1 and Q2 are applied to the bases of the pull-down transistors Q5 and Q6 respectively.

Further, the emitter-follower currents Ie1 and Ie2 are substantially linearly changed with potential changes of the input terminals Vi1 and Vi2 when a potential differences between the input terminals Vi1 or Vi2 and the second power supply terminal Vee is large, i.e., when the voltages which are applied across the resistances R3 and R4 shown in FIG. 1 are larger than the base-to-emitter voltages of the pull-down transistors Q5 and Q6, since the emitter-follower currents Ie1 and Ie2 are substantially decided by the voltages which are applied across the resistances R3 and R4.

According to the second embodiment, on the other hand, it is possible to desirably set potentials which are applied to bases of the pull-down transistors Q5 and Q6 due to insertion of the resistances R5 and R6, thereby freely setting operating characteristics of the transistors Q5 and Q6. Since no emitter resistances R3 and R4 are provided, emitter-follower currents Ie1 and Ie2 are exponentially increased with the potentials at input terminals Vi1 and Vi2, whereby effects of high-speed operations and low current consumption are enhanced.

Also in the second embodiment, current sources I2 and I3 may simply be formed by resistances.

Embodiment 3

Figure 3:
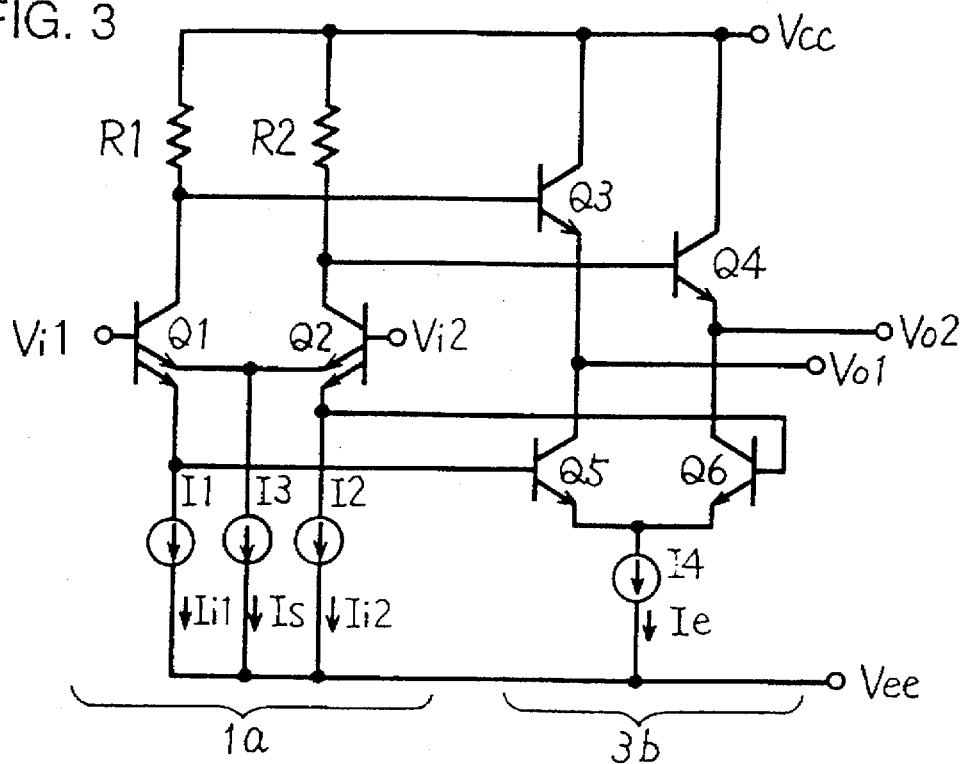
FIG. 3 is a circuit diagram showing the structure of an emitter-coupled logic circuit according to a third embodiment of the present invention.

FIG. 3 is a circuit diagram showing the structure of an emitter-coupled logic circuit 3 according to a third embodiment of the present invention. This emitter-coupled logic circuit 3 includes a current switching circuit 1a which is identical in structure to that shown in FIG. 1, and an emitter-follower circuit 3b. This emitter-coupled logic circuit 3 is different from that of FIG. 1 in a point that emitters of pull-down transistors Q5 and Q6 are connected together to a second power supply terminal Vee through a fourth current source I4.

In the emitter-coupled logic circuit 3, the current switching circuit 1a is identical in operation to that shown in FIG. 1. In the emitter-follower circuit 3b, the pull-down transistors Q5 and Q6 form an emitter-coupled differential stage. Namely, the pull-down transistors Q5 and Q6 enter a conducting state and a cutoff state respectively when signals of logical high and low levels are supplied to input terminals Vi1 and Vi2 respectively. A pull-up transistor Q3 is in a cutoff state, and an output terminal Vo1 is driven to a logical low level by an emitter-follower current Ie flowing into the second power supply terminal Vee through the pull-down transistor Q5 and a current source I4. On the other hand, a pull-up transistor Q4 is in a conducting state and the pull-down transistor Q6 is in a cutoff state, whereby an output terminal Vo2 is driven to a logical high level corresponding to a voltage level which is supplied to a first power supply terminal Vcc by the pull-up transistor Q4. Thus, substantially no emitter-follower current Ie flows in an output terminal which is driven to a logical high level while the emitter-follower current Ie flows in an output terminal which is driven to a logical low level, whereby an effect similar to those of the first and second embodiments can be provided. It is possible to drive the pull-down transistors Q5 and Q6 at a high speed by connecting the emitters thereof together.

Since the emitters of the pull-down transistors Q5 and Q6 are connected in common to the single current source I4, the emitter-follower current Ie flows only in one of the pull-down transistors, whereby it is possible to halve the emitter-follower current Ie and to reduce the circuit scale.

Embodiment 4

Figure 4:
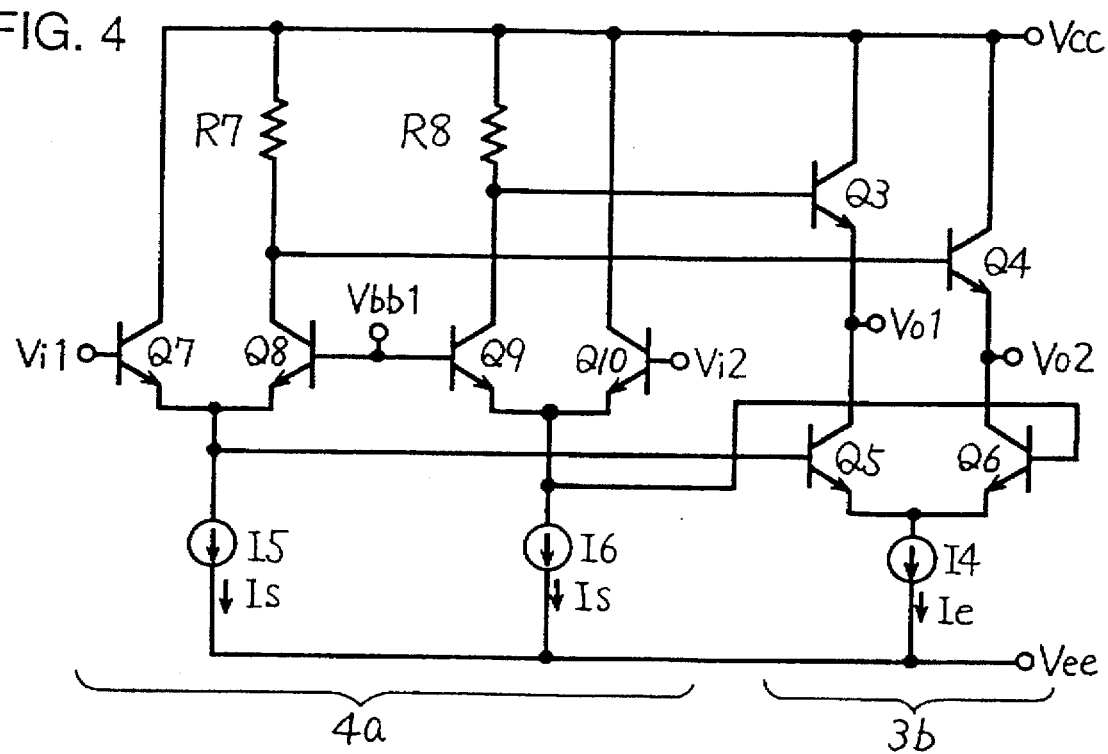
FIG. 4 is a circuit diagram showing the structure of an emitter-coupled logic circuit according to a fourth embodiment of the present invention.

FIG. 4 is a circuit diagram showing the structure of an emitter-follower coupled circuit 4 according to a fourth embodiment of the present invention. Referring to FIG. 4, the emitter-coupled logic circuit 4 includes first and second input terminals Vi1 and Vi2, a reference potential terminal Vbb1, first and second output terminals Vo1 and Vo2, and first and second power supply terminals Vcc and Vee. A reference potential providing threshold values of logics of logic signals which are inputted in the input terminals Vi1 and Vi2 is applied to the reference potential terminal Vbb1. The emitter-coupled logic circuit 4 further includes a current switching circuit 4a and an emitter-follower circuit 3b which is identical in structure to that shown in FIG. 3.

The current switching circuit 4a includes input transistors Q7 and Q10, reference transistors Q8 and Q9, resistances R7 and R8, and current sources I5 and I6. The input transistors Q7 and Q10 have bases which are connected to the input terminals Vi1 and Vi2 respectively, collectors which are connected to the first power supply terminal Vcc, and emitters which are connected to the second power supply terminal Vee through the current sources I5 and I6 respectively. The reference transistors Q8 and Q9 have bases which are connected to the reference potential terminal Vbb1 in common, collectors which are connected to the first power supply terminal Vcc through the resistances R7 and R8 respectively, and emitters which are connected to the emitters of the input transistors Q7 and Q10 respectively.

The reference transistors Q8 and Q9 further have collectors which are connected to bases of pull-up transistors Q4 and Q3 respectively.

The operation is now described. When logic signals which are inputted in the input terminals Vi1 and Vi2 are changed from logical low and high levels to logical high and low levels respectively, the transistors Q7 and Q9 enter conducting states and the transistors Q8 and Q10 enter cutoff states respectively. Switching currents Is of the current sources I5 and I6 mostly flow in the transistors Q7 and Q9, respectively. Due to a voltage drop across the resistance R8, the base potentials of the pull-up transistors Q3 and Q4 are reduced and increased respectively, so that the pull-up transistors Q3 and Q4 enter a cutoff state and a conducting state respectively.

On the other hand, the base potential of the pull-down transistor Q5 is increased in accordance with the signal which is supplied to the input terminal Vi1 while that of the pull-down transistor Q6 is reduced to a level Vbb1−VBE, by a signal of a logical low level which is supplied to the input terminal Vi2, where VBE represents the base-to-emitter voltage of the transistor Q9. Thus, most of an emitter-follower current Ie by the current source I4 flows in the pull-down transistor Q5. Therefore, charges of a load capacitance CL1 (not shown) which is connected to the output terminal Vo1 are rapidly extracted, whereby the potential at the output terminal Vo1 is rapidly changed from a logical high level to a logical low level. Most of an emitter current of the pull-up transistor Q4 is used for charging a load capacitance CL2 (not shown), whereby the potential at the output terminal Vo2 is rapidly changed from a logical low level to a logical high level.

When the logic signal which is inputted in the input terminal Vi1 is changed from a logical high level to a logical low level, the logics of the logic signals which are supplied to the input terminals Vi1 and Vi2 are simply inverted to those described above.

According to the fourth embodiment, the emitters of the pull-down transistors Q5 and Q6 are connected to the single current source I4 in common for reducing the emitter-follower current Ie, while the emitter-follower current Ie is cut off when the output signal is changed from a logical low level to a logical high level and the same is fed when the signal is changed from a logical high level to a logical low level with respect to one output terminal, whereby load drivability is improved and it is possible to reduce the emitter-follower current Ie as compared with an arrangement regularly feeding the current, thereby reducing power consumption.

While the switching current Is is required to be doubled as compared with that in each of the emitter-coupled logic circuits 1 to 3 shown in FIGS. 1 to 3 and power consumption is increased in these portions, the overall power consumption is reduced as compared with the prior art circuit since the switching currents Is are generally set to be identical to or smaller than the emitter-follower current Ie.

Further, this embodiment has such an advantage that it is possible to control the emitter-follower current Ie by supplying complementary logic input signals to differential amplifiers which are independent of each other, thereby allowing the formation of signals of complementary logics. The pull-down transistors Q5 and Q6 provide high speed response since they receive signals from emitters of input transistors Q7 and Q10 at the bases thereof and form an emitter-coupled logic.

In addition, each of the input complementary logic signals drives only one transistor and hence it is only required to drive a small input capacitance. Resistances R7 and R8 are connected to the respective collectors of the reference transistors Q8 and Q9 whose bases are supplied with the reference potential Vbb1, to provide the base potentials of pull-up transistors Q4 and Q3, whereby the circuit operates at a high speed with no Miller effects of base-to-collector parasitic capacitances of the transistors Q8 and Q9.

Further, the circuit can be formed by only NPN transistors and resistances with no requirement for special elements such as the capacitive element C31 for capacitive coupling, the PNP transistor Q31 and the Schottky diode SD31, dissimilarly to the prior art, whereby the wafer process is not complicated and the manufacturing cost is not increased. In addition, it is possible to take out complementary output signals.

Embodiment 5

Figure 5:
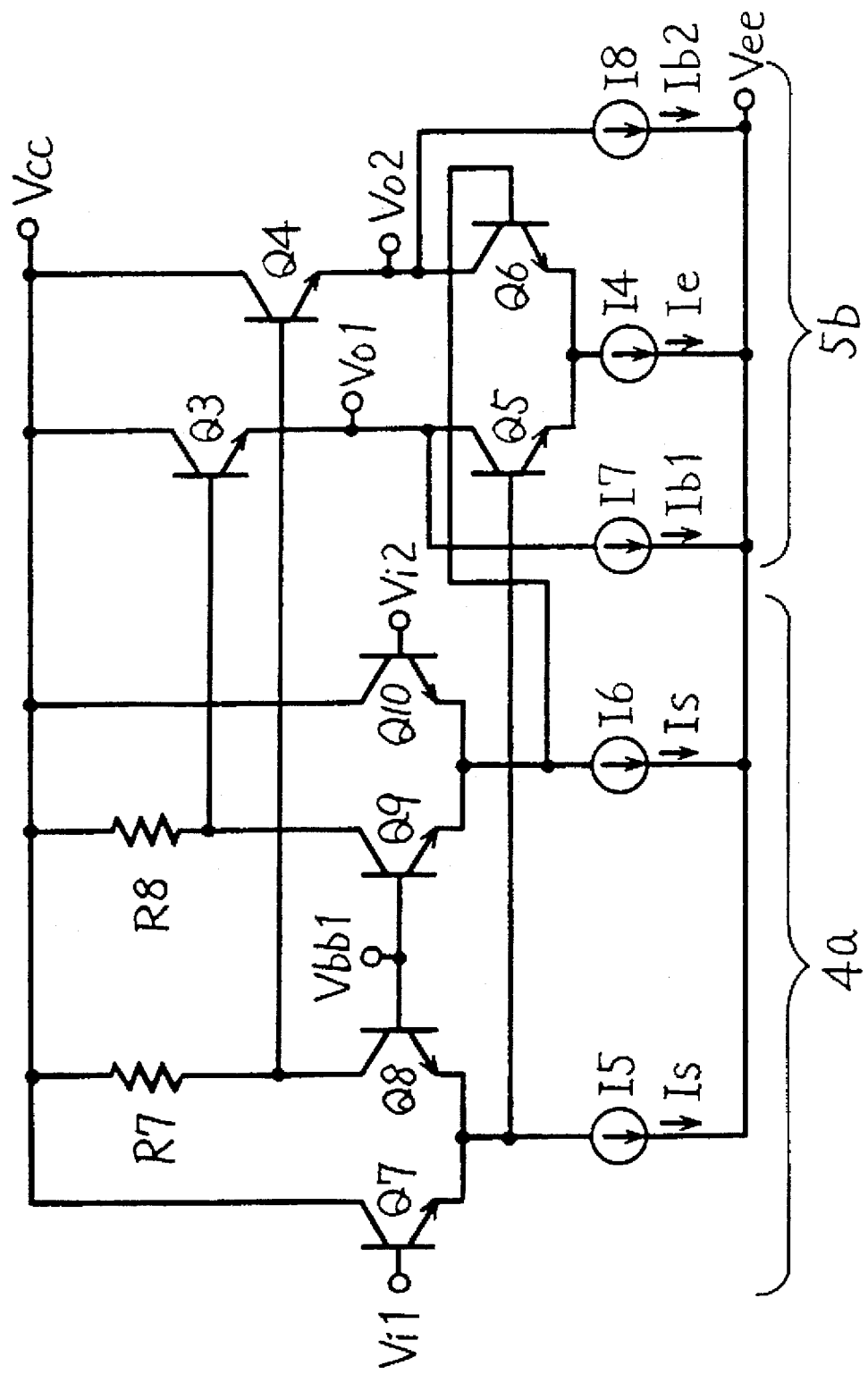
FIG. 5 is a circuit diagram showing the structure of an emitter-coupled logic circuit according to a fifth embodiment of the present invention.

FIG. 5 is a circuit diagram showing the structure of an emitter-coupled logic circuit 5 according to a fifth embodiment of the present invention. Referring to FIG. 5, this emitter-coupled logic circuit 5 includes a current switching circuit 4a which is identical in structure to that shown in FIG. 4, and an emitter-follower circuit 5b. The emitter-follower circuit 5b includes current sources I7 and I8 which are connected between output terminals Vo1 and Vo2 and a second power supply terminal Vee respectively, in addition to components identical to those of the emitter-follower circuit 3b shown in each of FIGS. 3 and 4.

In the emitter-follower circuit 3b, the pull-down transistor Q5 or Q6 enters a cutoff state when the output terminal Vo1 or Vo2 is at a logical high level. Therefore, substantially no current flows in the pull-up transistor Q3 or Q4 when the load capacitance is fully charged, and hence the output impedance may be extremely increased to unstabilize the output. In order to solve this problem, the current sources I7 and I8 are added to regularly feed currents Ib1 and Ib2 to pull-up transistors Q3 and Q4 which are to be in conducting states. The currents Ib1 and Ib2 flowing from the current sources I7 and I8 are set at the minimum necessary values for maintaining the pull-up transistors Q3 and Q4 in the conducting states, in order to suppress increase in power consumption. The operation itself of the circuit 5 shown in FIG. 5 is identical to that of the circuit 4 shown in FIG. 4.

Embodiment 6

Figure 6:
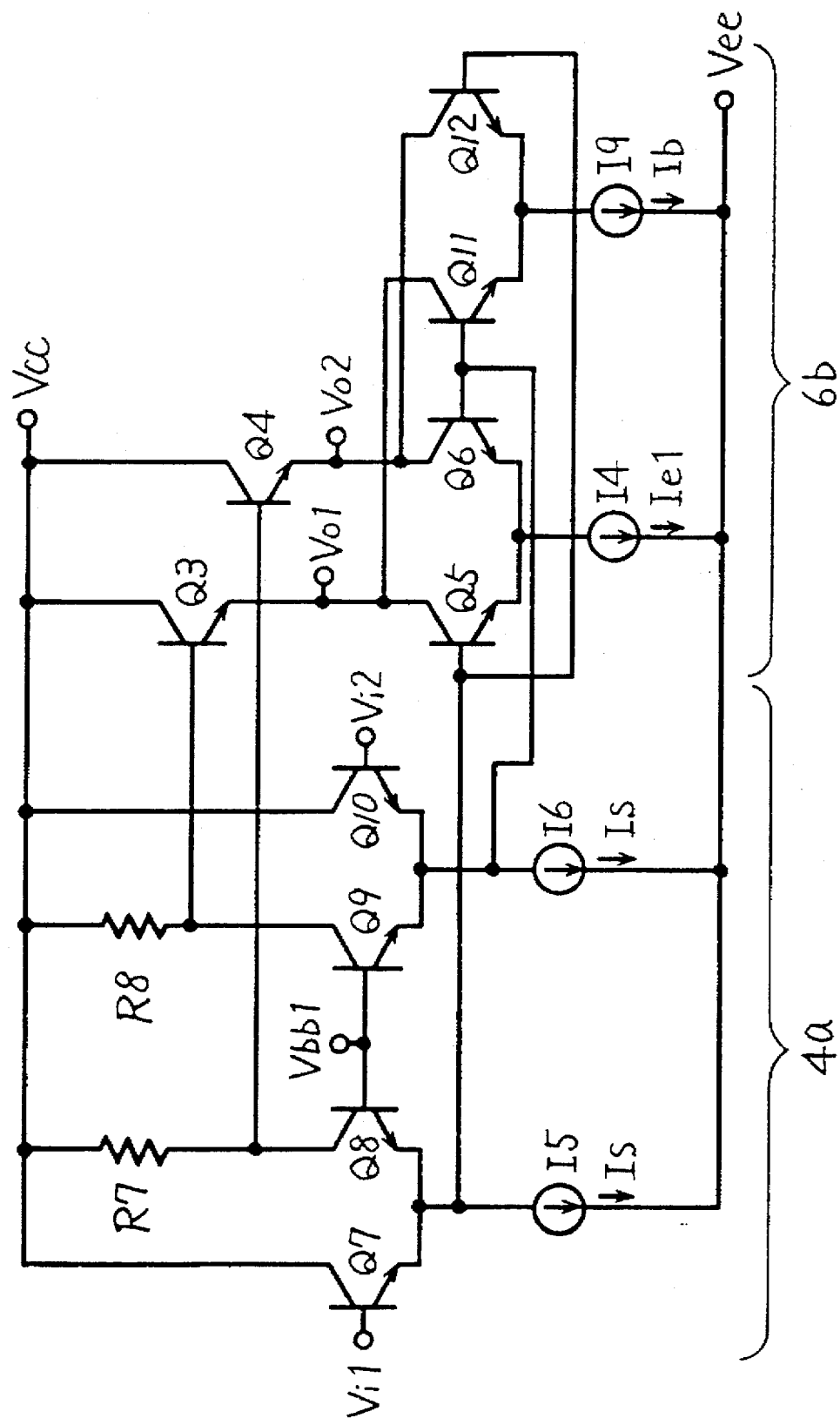
FIG. 6 is a circuit diagram showing the structure of an emitter-coupled logic circuit according to a sixth embodiment of the present invention.

FIG. 6 is a circuit diagram showing an emitter-coupled logic circuit 6 according to a sixth embodiment of the present invention. Referring to FIG. 6, this emitter-coupled logic circuit 6 includes a current switching circuit 4a which is identical in structure to that shown in each of FIGS. 4 and 5, and an emitter-follower circuit 6b. The emitter-follower circuit 6b has such a structure that stabilizing transistors Q11 and Q12 and a current source I9 are added to an emitter-follower circuit which is identical in structure to that shown in each of FIGS. 3 and 4. The stabilizing transistor Q11 has a base which is connected to a base of pull-down transistor Q6, a collector which is connected to output terminal Vo1, and an emitter which is connected to second power supply terminal Vee through the current source I9. Further, the stabilizing transistor Q12 has a base which is connected to a base of pull-down transistor Q5, a collector which is connected to output terminal Vo2, and an emitter which is connected to the emitter of the stabilizing transistor Q11.

When transistors Q4 and Q5 enter conducting states and transistors Q3 and Q6 enter cutoff states in response to outputs from collectors and emitters of reference transistors Q8 and Q9, the stabilizing transistors Q12 and Q11 enter a conducting state and a cutoff state respectively. Also after a load capacitance of the output terminal Vo2 is charged up to a voltage level (Vcc–VBE) of first power supply terminal Vcc, a current Ib through the current source I9 flows in the pull-up transistor Q4 through the stabilizing transistor Q12, for preventing the pull-up transistor Q4 from entering a cutoff state to provide an instable operation. When the transistors Q3 and Q6 enter conducting states and the transistors Q4 and Q5 enter cutoff states, on the other hand, the current Ib regularly flows in the pull-up transistor Q3 through the stabilizing transistor Q11, for preventing the pull-up transistor Q3 from an instable operation.

According to the sixth embodiment, an emitter-follower current Ie1 or the bias current Ib regularly flows in the pull-up transistor Q3 or Q4 which is in a conducting state, whereby the transistor Q3 or Q4 is still supplied with the current even when the load capacitance is fully charged, and it is possible to prevent extreme increase in output impedance and an instable output. Increase in power consumption is small since it is possible to set the bias current Ib at an extremely small value.

Embodiment 7

Figure 7:
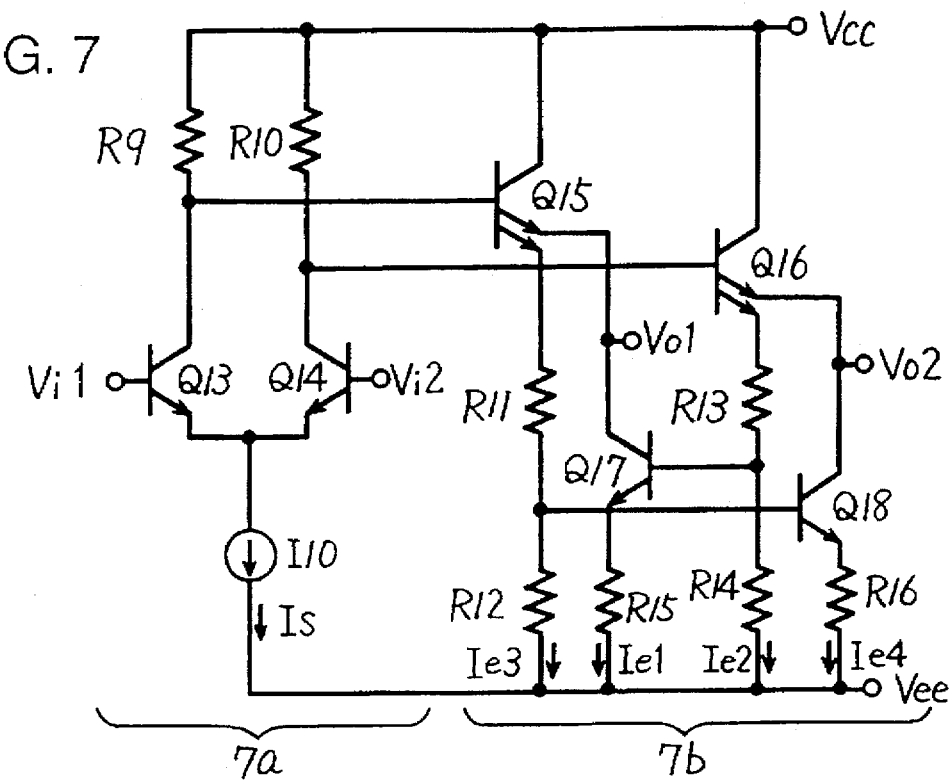
FIG. 7 is a circuit diagram showing the structure of an emitter-coupled logic circuit according to a seventh embodiment of the present invention.

FIG. 7 is a circuit diagram showing the structure of an emitter-coupled logic circuit 7 according to a seventh embodiment of the present invention. Referring to FIG. 7, this emitter-coupled logic circuit 7 includes first and second input terminals Vi1 and Vi2, first and second output terminals Vo1 and Vo2, and first and second power supply terminals Vcc and Vee. The emitter-coupled logic circuit 7 further includes a current switching circuit 7a and an emitter-follower circuit 7b.

The current switching circuit 7a includes input transistors Q13 and Q14, resistances R9 and R10, and a current source I10. The input transistors Q13 and Q14 have bases which are connected to the input terminals Vi1 and Vi2 respectively, collectors which are connected to the first power supply terminal Vcc through the resistances R9 and R10 respectively, and emitters which are connected together to the second power supply terminal Vee through the current source I10.

The emitter-follower circuit 7b includes multi-emitter transistors Q15 and Q16, pull-down transistors Q17 and Q18, and resistances R11 to R16. The multi-emitter transistor Q15 has a base which is connected to the collector of the input transistor Q13, a collector which is connected to the first power supply terminal Vcc, a first emitter which is connected to the second power supply terminal Vee through the voltage dividing resistances R11 and R12, and a second emitter which is connected to the output terminal Vo1. The multi-emitter transistor Q16 has a base which is connected to the collector of the input transistor Q14, a collector which is connected to the first power supply terminal Vcc, a first emitter which is connected to the second power supply terminal Vee through the voltage dividing resistances R13 and R14, and a second emitter which is connected to the output terminal Vo2. The pull-down transistor Q17 has a base which is connected to a junction node between the voltage dividing resistances R13 and R14, a collector which connected to the output terminal Vo1, and an emitter which is connected to the second power supply terminal Vee through the resistance R15. The pull-down transistor Q18 has a base which is connected to a junction node between the voltage dividing resistances R11 and R12, a collector which is connected to the output terminal Vo2, and an emitter which is connected to the second power supply terminal Vee through the resistance R16.

The operation is now described. When a logic signal which is inputted in the input terminal Vi1 is changed from a logical low level to a logical high level and that inputted in the input terminal Vi2 is changed from a logical high level to a logical low level, the input transistors Q13 and Q14 enter a conducting state and a cutoff state respectively. Most of a switching current Is of the current source I10 flows in the input transistor Q13, so that the base potential of the multi-emitter transistor Q15 is reduced by a voltage drop across the resistance R9 and the multi-emitter transistor Q15 enters a cutoff state. On the other hand, the multi-emitter transistor Q16 enters a conducting state due to increase in its base potential.

The base of the pull-down transistor Q17 is supplied with a potential which is decided by the resistance ratio between the voltage dividing resistances R13 and R14 and the difference between the first emitter potential of the multi-emitter transistor Q16 and the potential of the second power supply terminal Vee. The emitter potential of the multi-emitter transistor Q16 is increased, whereby the base potential of the pull-down transistor Q17 is also increased so that an emitter-follower current Ie1 flowing in the resistance R15 is increased to rapidly full the potential of the output terminal Vo1. Similarly, the base potential of the pull-down transistor Q18 is reduced, whereby an emitter-follower circuit Ie4 flowing in the resistance R16 is reduced. Most of an emitter current of the multi-emitter transistor Q16 is used for charging a load capacitance associated with the output terminal Vo2, whereby the potential at the output terminal Vo2 is rapidly changed from a logical low level to a logical high level.

When a logic signal which is inputted in the input terminal Vi1 is changed from a logical high level to a logical low level, logics of complementary logic signals which are supplied to the input terminals Vi1 and Vi2 have only to be inverted, and similar operations are carried out.

In the seventh embodiment of the present invention, the emitter-follower current is reduced when the output signal is changed from a logical low level to a logical high level and is increased when the output signal is changed from a logical high level to a logical low level with respect one output terminal, whereby load drivability is improved. Further, it is possible to reduce the overall emitter-follower current, thereby reducing power consumption. A current Ie3 flowing through the voltage dividing resistances R11 and R12 and a current Ie2 flowing through the voltage dividing resistances R13 and R14 are set at minimum necessary values only for driving the pull-down transistors Q18 and Q17 respectively.

The overall circuit 7 can be formed by only NPN transistors and resistances, with no requirement for special elements such as the capacitive element C31 for capacitive coupling, the PNP transistor QP31 and the Schottky diode SD31, dissimilarly to the prior art, whereby the wafer process is not complicated and the manufacturing cost is not increased. Further, it is possible to advantageously take out complementary output signals.

Figure 8:
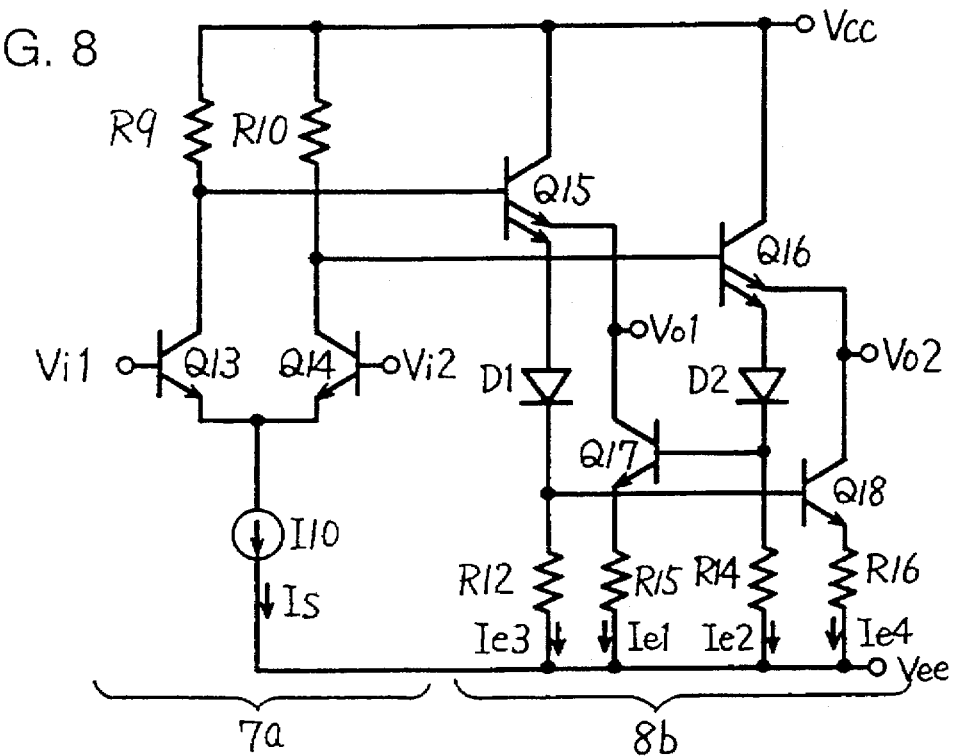
FIG. 8 is a circuit diagram showing the structure of an emitter-coupled logic circuit according to a modification of the seventh embodiment of the present invention.

The resistances R11 and R13, which have level shift functions for preventing the pull-down transistors Q18 and Q17 from saturation and slow-down in speed of response, may be replaced by diodes D1 and D2 respectively as shown in FIG. 8, to provide a similar effect. In the structure shown in FIG. 8, the diodes D1 and D2, which are formed by PN diodes, can be prepared through the same manufacturing process steps as those for bipolar transistors which are circuit components.

Embodiment 8

Figure 9:
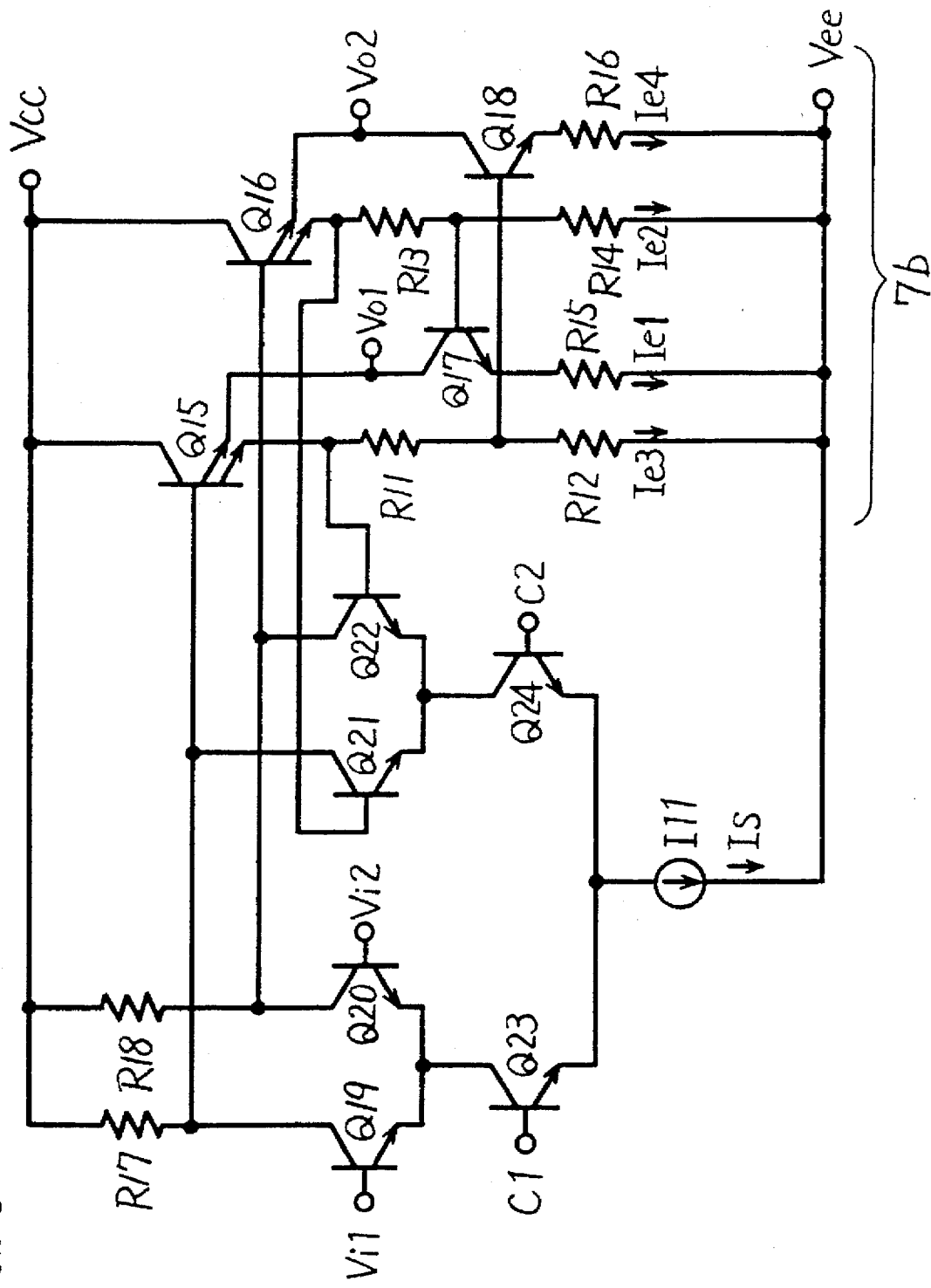
FIG. 9 is a circuit diagram showing the structure of a latch circuit according to an eighth embodiment of the present invention.

FIG. 9 is a circuit diagram showing the structure of a latch circuit 9 according to an eighth embodiment of the present invention. Referring to FIG. 9, this latch circuit 9 includes data input terminals Vi1 and Vi2, clock input terminals C1 and C2, output terminals Vo1 and Vo2, and first and second power supply terminals Vcc and Vee. Data signals which are complementary in logic with each other are inputted in the data input terminals Vi1 and Vi2 respectively. Clock signals which are complementary in logic with each other are inputted in the clock input terminals C1 and C2 respectively.

This latch circuit 9 further includes an emitter-follower circuit 7b which is identical in structure to that shown in FIG. 7, transistors Q19 to Q24, resistances R17 and R18, and a current source I11. The transistors Q19 and Q20 form a data write circuit, and the transistors Q21 and Q22 form a data hold circuit.

The transistors Q19 and Q20 have bases which are connected to the data input terminals Vi1 and Vi2 respectively, collectors which are connected to the first power supply terminal Vcc and bases of multi-emitter transistors Q15 and Q16 through the resistances R17 and R18 respectively, and emitters which are connected together to a collector of the transistor Q23. The transistors Q21 and Q22 have bases which are connected to first emitters of the multi-emitter transistors Q16 and Q15 respectively, collectors which are connected to bases of the multi-emitter transistors Q15 and Q16 respectively, and emitters which are connected together to a collector of the transistor Q24. The transistors Q23 and Q24 have bases which are connected to the clock input terminals C1 and C2 respectively, and emitters which are connected together to the second power supply terminal Vee through the current source I11.

The operation is now described. When the clock signal which is inputted in the clock input terminal C1 is at a logical low level, the clock signal inputted in the clock input terminal C22 is at a logical high level. In this state, the transistor Q23 enters a conducting state to activate the data write circuit, while the transistor Q24 enters a cutoff state to inactivate the data hold circuit. When the data signal (referred to as ID1) which is inputted in the input terminal Vi1 is at a logical high level at this time, the transistors Q19 and Q20 enter a conducting state and a cutoff state respectively, whereby a switching current Is which is determined in value by the current source I11 flows in the resistance R17 through the transistors Q23 and Q19. Therefore, the multi-emitter transistor Q15 enters a cutoff state, and its emitters are at logical low levels. Substantially no current flows in the resistance R18 due to the cutoff state of the transistor Q20, whereby the multi-emitter transistor Q16 enters a conducting state and its emitters are at logical high levels. The operation of the emitter-follower circuit 7b is identical to that of the circuit shown in FIG. 7.

When the clock signal which is inputted in the clock input terminal C1 is changed from the logical high level to a logical low level, the transistor Q24 enters a conducting state to activate the data hold circuit. On the other hand, the transistor Q23 enters a cutoff state to inactivate the data write circuit. Due to the data signal ID1 which has been inputted when the clock signal inputted in the clock input terminal C1 has been at a logical high level, the emitter potentials of the multi-emitter transistor Q16 are at logical high levels. The transistors Q21 and Q22 enter a conducting state and a cutoff state respectively, thereby holding the base potentials of the multi-emitter transistors Q15 and Q16. Therefore, the multi-emitter transistors Q15 and Q16 are maintained in the same states as those when the clock signal of a logical high level has been inputted in the clock input terminal C1, to continuously output the same data signals.

Also according to this embodiment, it is possible to attain reduction of power consumption and improvement of load drivability, similarly to the embodiment shown in FIG. 7.

Embodiment 9

Figure 10:
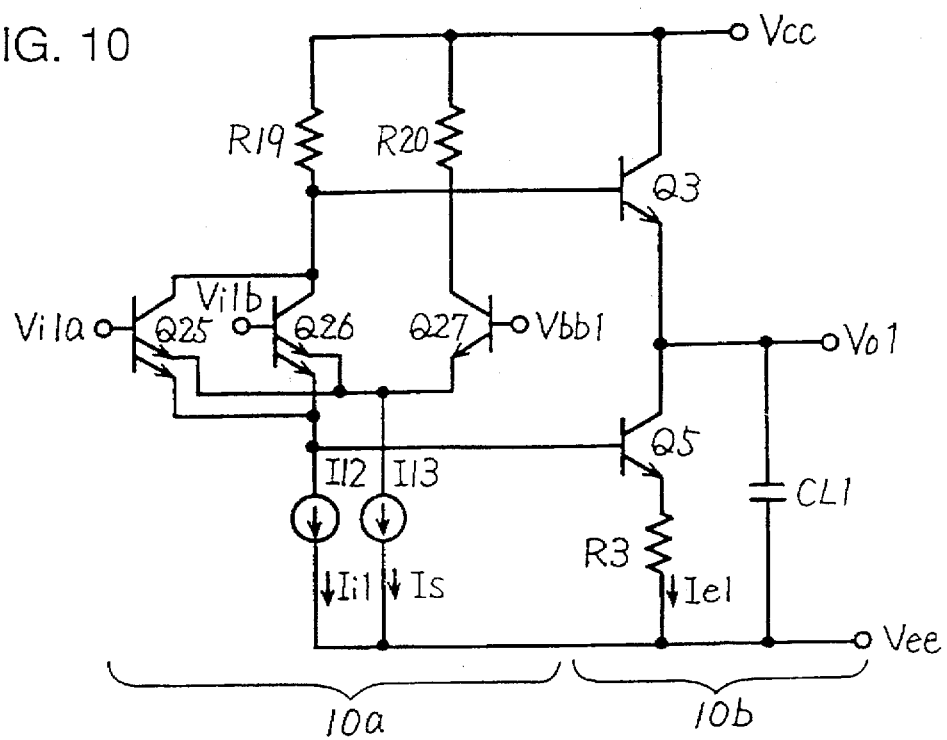
FIG. 10 is a circuit diagram showing the structure of a NOR logic circuit according to a ninth embodiment of the present invention.

FIG. 10 is a circuit diagram showing the structure of a two-input NOR logic circuit 10 according to a ninth embodiment of the present invention. Referring to FIG. 10, this NOR logic circuit 10 includes first and second input terminals Vi1a and Vi1b, a reference potential terminal Vbb1, an output terminal Vo1, and first and second power supply terminals Vcc and Vee. The input terminals Vi1a and Vi1b receive data signals respectively. The NOR logic circuit 10 further includes a logical operation circuit 10a and an emitter-follower circuit 10b.

The logical operation circuit 10a includes multi-emitter transistors Q25 and Q26, a reference transistor Q27, resistances R19 and R20, and current sources I12 and I13. The multi-emitter transistors Q25 and Q26 have bases which are connected to the input terminals Vi1a and Vi1b respectively, collectors which are connected together to the first power supply terminal Vcc through the resistance R19, first emitters which are connected together to the second power supply terminal Vee through the current source I12, and second emitters which are connected together to the second power supply terminal Vee through the current source I13. The reference transistor Q27 has a base which is connected to the reference potential terminal Vbb1, a collector which is connected to the first power supply terminal Vcc through the resistance R20, and an emitter which is connected to the second emitters of the multi-emitter transistors Q25 and Q26.

The emitter-follower circuit 10b includes a pull-up transistor Q3, a pull-down transistor Q5, and a resistance R3. The pull-up transistor Q3 has a base which is connected to the collectors of the multi-emitter transistors Q25 and Q26, a collector which is connected to the first power supply terminal Vcc, and an emitter which is connected to the output terminal Vo1. The pull-down transistor Q5 has a base which is connected to the first emitters of the multi-emitter transistors Q25 and Q26, a collector which is connected to the output terminal Vo1, and an emitter which is connected to the second power supply terminal Vee through the resistance R3. A load capacitance CL1 such as an interconnection line capacitance or an input capacitance of a next stage circuit is present between the output terminal Vo1 and the second power supply terminal Vee.

The operation is now described. When a potential of at least one of the input terminals Vi1a and Vi1b is changed from a logical low level to a logical high level, the corresponding multi-emitter transistor Q25 and/or Q26 enters a conducting state, and the reference transistor Q27 enters a cutoff state. Most of a switching current Is by the current source I13 flows in the resistance R19, and the base potential of the pull-up transistor Q3 is reduced by a voltage drop by the resistance R19, so that the pull-up transistor Q3 enters a cutoff state. On the other hand, the base potential of the pull-down transistor Q5 is increased in accordance with the signal which is supplied to the input terminal Vi1a or Vi1b, so that an emitter-follower current Ie1 flowing through the resistance R3 is increased. Thus, charges of the load capacitance CL1 of the output terminal Vo1 are rapidly extracted, whereby the potential of the output terminal Vo1 is rapidly changed from a logical high level to a logical low level. When both of the input terminals Vi1a and Vi1b are at logical low levels, on the other hand, the base potential of the pull-up transistor Q3 is increased and that of the pull-down transistor Q5 is reduced, whereby an emitter current of the pull-up transistor Q3 is used for charging the load capacitance CL1 and the output terminal Vo1 rapidly rises from a logical low level to a logical high level.

According to the ninth embodiment, the emitter-follower current is reduced when the output signal is changed from a logical low level to a logical high level, while it is increased when the output signal is changed from a logical high level to a logical low level, whereby load drivability is improved and it is possible to reduce the emitter-follower current in output charging, thereby reducing power consumption. A potential amplitude which is applied to the base of the pull-down transistor Q5 is substantially equal to the logic amplitudes of the input signals, whereby it is possible to change the emitter-follower current to a greater extent for increasing the operation speed without increasing an input capacitance, while the circuit stably operates.

The circuit 10 can be formed by only NPN transistors and resistances, with no requirement for special elements such as the capacitive element C31 for capacitive coupling, the PNP transistor QP31 and the Schottky diode SD31, dissimilarly to the prior art, whereby the wafer process is not complicated and the manufacturing cost is not increased.

Further, the base of the pull-down transistor Q5 is supplied with the input logic signals through the first emitters of the multi-emitter transistors Q25 and Q26, whereby the speed of response is increased. In addition, the current source I12 may simply be formed by a resistance. In this case, the number of elements can be reduced as compared with the conventional emitter-coupled logic circuit.

Further, it is possible to suppress increase in input capacitance by employing the multi-emitter transistors Q25 and Q26 as input transistors. A current value I11 of the current source I12, which is simply adapted to drive the input capacitance of the pull-down transistor Q5, can be set at a sufficiently small level as compared with the switching current Is and the emitter-follower current Ie1, whereby increase in power consumption is very small. Due to the current source I12, logical high and low levels of the base potential of the pull-up transistor Q3 voltage-drop by R19× Ii1, whereby the circuit 10 can be also employed as a level shifting circuit, similarly to the circuit shown in FIG. 1.

While the ninth embodiment has been described with reference to the two-input NOR logic circuit 10, it is possible to form a multi-input NOR logic circuit by further increasing the number of the input multi-emitter transistors Q25 and Q26, as a matter of course.

Embodiment 10

Figure 11:
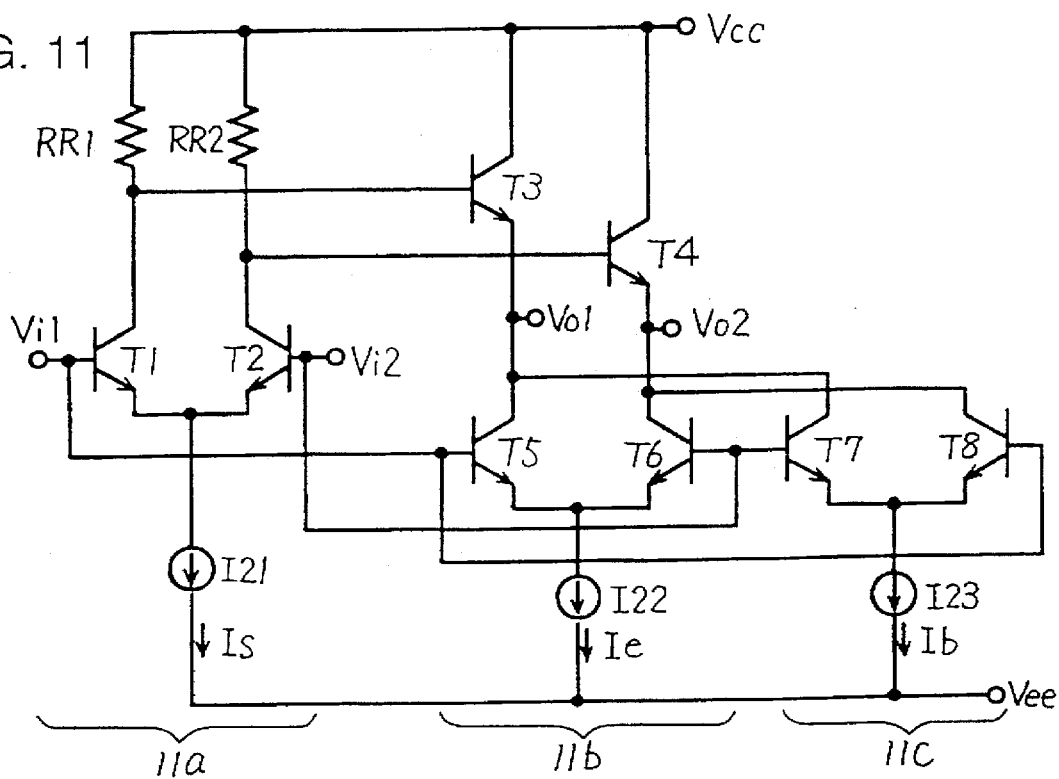
FIG. 11 is a circuit diagram showing the structure of an emitter-coupled logic circuit according to a tenth embodiment of the present invention.

FIG. 11 is a circuit diagram showing the structure of an emitter-coupled logic circuit 11 according to a tenth embodiment of the present invention. Referring to FIG. 11, the emitter-coupled logic circuit 11 includes a current switching circuit 11a for differentially amplifying complementary logic signals which are supplied to input terminals Vi1 and Vi2, an emitter-follower circuit 11b for driving output terminals Vo1 and Vo2 to logical levels corresponding to those of the input complementary signals in response to an output signal from the current switching circuit 11a, and a stabilizing circuit 11c serving as current control means for preventing the emitter-follower circuit 11b from entering an output high impedance state.

The current switching circuit 11a includes input transistors T1 and T2 which are formed by NPN bipolar transistors, a current source I1, and resistive elements RR1 and RR2. The input transistor T1 has a base which is connected to the input terminal Vi1, a collector which is coupled to a first power supply terminal Vcc through the resistive element RR1, and an emitter which is coupled to a second power supply terminal Vee through the current source I1. The input transistor T2 has a base which is connected to the input terminal Vi2, a collector which is coupled to the first power supply terminal Vcc through the resistive element RR2, and an emitter which is connected to that of the input transistor T1 and coupled to the second power supply terminal Vee through the current source I1.

The emitter-follower circuit 11b includes pull-up transistors T3 and T4 for pulling up the output terminals Vo1 and Vo2 to logical high levels respectively, pull-down transistors T5 and T6 for pulling down the output terminals Vo1 and Vo2 to logical low levels respectively, and a current source I22. The pull-up transistor T3 has a base which is connected to the collector of the input transistor T1, a collector which is connected to the first power supply terminal Vcc, and an emitter which is connected to the output terminal Vo1. The pull-up transistor T4 has a base which is connected to the collector of the input transistor T2, a collector which is connected to the first power supply terminal Vcc, and an emitter which is connected to the second output terminal Vo2.

The pull-down transistor T5 has a base which is connected to receive an input logic signal supplied to the input terminal Vi1, a collector which is connected to the output terminal Vo1, and an emitter which is coupled to the second power supply terminal Vee through the current source I22. The pull-down transistor T6 has a base which is connected to receive an input logic signal supplied to the input terminal Vi2, a collector which is connected to the output terminal Vo2, and an emitter which is connected to that of the pull-down transistor T5 and coupled to the second power supply terminal Vee through the current source I22.

The stabilizing circuit 11c includes stabilizing transistors T7 and T8 forming an emitter-coupled logic, and a current source I23 having sufficiently smaller current driving capability than the current source I22 has. The stabilizing transistor T7 has a base which is connected to receive the input logic signal supplied to the input terminal Vi2, a collector which is connected to the output terminal Vo1, and an emitter which is coupled to the second power supply terminal Vee through the current source I23. The stabilizing transistor T8 has a base which is connected to receive the input signal supplied to the input terminal Vi1, a collector which is connected to the output terminal Vo2, and an emitter which is connected to that of the stabilizing transistor T7 and coupled to the second power supply terminal Vee through the current source I23. A current Ib flowing through the current source I23 is set at the minimum necessary value for maintaining the pull-up transistors T3 and T4 in conducting states.

The operation is now described. When the input logic signal which is supplied to the input terminal Vi1 is changed from a logical low level to a logical high level, that supplied to the input terminal Vi2 is changed from a logical high level to a logical low level. In this state, the input transistors T1 and T2 enter a conducting state and a cutoff state respectively, whereby a switching current Is flowing through the current source I21 flows from the first power supply terminal Vcc through the resistive element RR1 and the input transistor T1. The base potential of the pull-up transistor T3 is changed to a logical low level by a voltage drop across the resistive element RR1, while the base potential of the pull-up transistor T4 is changed to a logical high level since substantially no current flows in the resistive element RR2. Thus, the pull-up transistors T3 and T4 enter a cutoff state and a conducting state respectively.

On the other hand, the pull-down transistor T5 enters a conducting state in response to the input logic signal which is supplied to the input terminal Vi1, while the pull-down transistor T6 enters a cutoff state in response to the input logic signal which is supplied to the input terminal Vi2. A load capacitance (not shown) associated with the output terminal Vo1 is discharged by an emitter-follower current Ie through the pull-down transistor T5 and the current source I22, whereby the potential of the output terminal Vo1 is rapidly changed to a logical low level. On the other hand, the potential of the output terminal Vo2 is changed to a logical high level since the pull-up transistor T4 and the pull-down transistor T6 are in a conducting state and a cutoff state respectively.

In the stabilizing circuit 11c, the stabilizing transistors T7 and T8 enter a cutoff state and a conducting state in response to the input logic signals which are supplied to the input terminals Vi2 and Vi1 respectively. When the pull-up transistor T4 drives the output terminal Vo2 to a logical high level, therefore, the output terminal Vo2 is discharged through the stabilizing transistor T8 and the current source I23, whereby the current Ib supplied by the current source I23 regularly flows in the pull-up transistor T4 at the minimum, so that the pull-up transistor T4 can be prevented from entering a cutoff state. Thus, it is possible to prevent cutoff states of the pull-up transistor T4 and the pull-down transistor T6 and therefore a high output impedance state, thereby preventing an output signal from the output terminal Vo2 from being unstabilized.

When the input logic signal which is supplied to the input terminal Vi1 is changed from a logical high level to a logical low level, the logics of the input logic signals supplied to the input terminals Vi1 and Vi2 are simply inverted in the above description, so that the output terminals Vo1 and Vo2 are at potentials of high and logical low levels respectively.

It is possible to rapidly drive each of the output terminals Vo1 and Vo2 to a desired logical high level by bringing one of the associated pull-up transistor and the pull-down transistor into the conducting state and bringing the other into the cutoff state.

Further, it is possible to drive the pull-down transistors T5 and T6 at high speeds since the pull-down transistors T5 and T6 are connected to form an emitter-coupled logic and structured to be driven by the input logic signals which are supplied to the input terminals Vi1 and Vi2. In addition, no structure for forming complementary logic signals and applying the same to the bases of the pull-down transistors T5 and T6 is required since these transistors are driven by the input logic signals, whereby the circuit scale is reduced and the circuit structure is simplified.

The circuit components are formed by only NPN bipolar transistors and resistances with no requirement for special elements such as a capacitive element for capacitive coupling, an output drive NPN bipolar transistor and a Schottky diode, dissimilarly to the prior art, whereby the wafer process can be prevented from being complicated and the manufacturing cost can be accordingly prevented from increase. Further, the complementary output signals can be generated in a simple structure. In addition, an emitter-follower current Ie or a bias current Ib regularly flows in the pull-down transistors T5 and T6 by the stabilizing circuit 11c, whereby it is possible to prevent output signals from being unstabilized by an extremely increased output impedance. Further, the current Ib flowing through the current source I23, which is simply required to maintain the pull-up transistors T3 and T4 in conducting states, can be set at an extremely small value and therefore increase in power consumption is extremely small.

The current sources I21 to I23 may alternatively be formed by resistive elements respectively.

Embodiment 11

Figure 12:
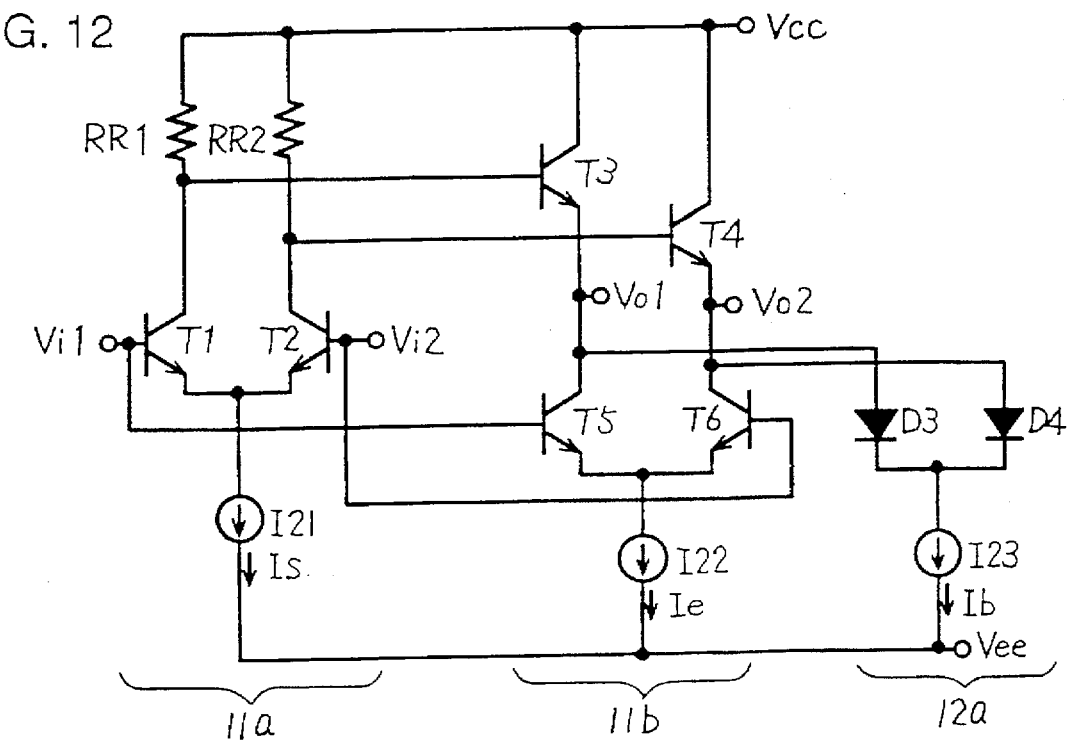
FIG. 12 is a circuit diagram showing the structure of an emitter-coupled logic circuit according to an eleventh embodiment of the present invention.

FIG. 12 is a circuit diagram showing the structure of an emitter-coupled logic circuit 12 according to an eleventh embodiment of the present invention. The emitter-coupled logic circuit 12 shown in FIG. 12 has the same structure as that shown in FIG. 11, except a stabilizing circuit 12a for stabilizing output signals of output terminals Vo1 and Vo2. In the emitter-coupled logic circuit 12 shown in FIG. 12, components corresponding to those shown in FIG. 11 are denoted by the same reference numerals, to omit the description thereof.

Referring to FIG. 12, the stabilizing circuit 12a includes a diode D3 having an anode which is connected to the output terminal Vo1 and a cathode which is connected to a second power supply terminal Vee through a current source I23, and a diode D4 having an anode which is connected to the output terminal Vo2 and a cathode which is connected to that of the diode D3 and coupled to the second power supply terminal Vee through the current source I23. The diodes D3 and D4 are formed by PN diodes.

Consider the case where the output signal of the output terminal Vo1 rises from a logical low level to a logical high level and that of the output terminal Vo2 is changed from a logical high level to a logical low level in accordance with complementary input logic signals which are supplied to the input terminals Vi1 and Vi2. At this time, the output terminal Vo1 is driven to a logical high level through a pull-up transistor T3, while the output terminal Vo2 is driven to a logical low level through a pull-down transistor T6. The potential of the anode of the diode D3 exceeds that of the diode D4, whereby the diode D3 enters a conducting state. The potential of the anode of the diode D3 is reduced by its forward voltage drop and transmitted to the cathode of the diode D4. Thus, the anode-to-cathode voltage of the diode D4 is reduced below the forward voltage drop or brought into a reverse-biased state, so that the diode D4 enters a cutoff state. Therefore, a current Ib flows to the pull-up transistor T3 through the diode D3 and the current source I23 when the output terminal Vo1 is driven to a logical high level by the pull-up transistor T3. Thus, the current regularly flows in the pull-up transistor T3 when the output terminal Vo1 is driven to a logical high level so that the pull-up transistor T3 is maintained in the conducting state, whereby all of the transistors T3 and T5 are not brought into cutoff states so that it is possible to prevent the output signal of the output terminal Vo1 from being unstabilized by an extremely increased impedance.

When the output signal of the output terminal Vo2 is at a logical high level, the diode D4 enters a conducting state and the diode D3 enters a cutoff state, so that it is possible to regularly feed a current to the pull-up transistor T4 similarly to the above described operation.

Also when the structure shown in FIG. 12 is employed, an emitter-follower current Ie or a bias current Ib regularly flows in the pull-up transistor which is brought into a conducting state, whereby the conducting state can be regularly maintained and an output high impedance state can be prevented, so that it is possible to stably output the output signal. Also in the structure shown in FIG. 12, an effect similar to that of the structure shown in FIG. 11 can be implemented.

Embodiment 12

Figure 13:
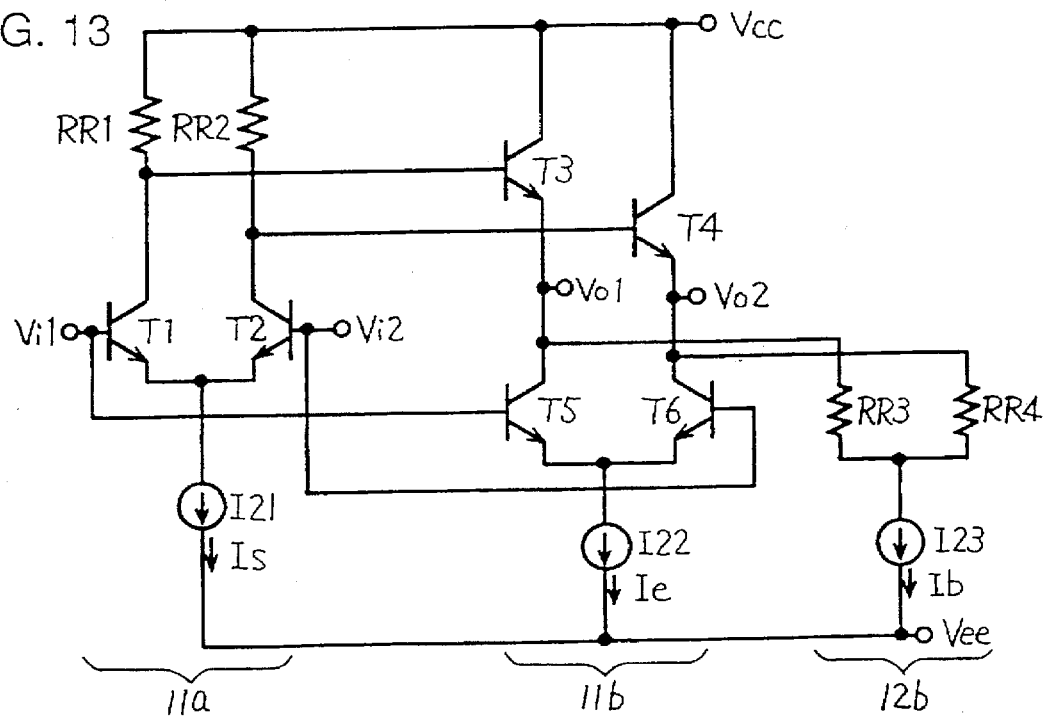
FIG. 13 is a circuit diagram showing the structure of an emitter-coupled logic circuit according to a twelfth embodiment of the present invention.

FIG. 13 is a circuit diagram showing the structure of an emitter-coupled logic circuit 13 according to a twelfth embodiment of the present invention. The emitter-coupled logic circuit 13 shown in FIG. 13 has the same structure as that shown in each of FIGS. 11 and 12, except a stabilizing circuit 12b. Referring to FIG. 13, components corresponding to those of the circuit shown in each of FIGS. 11 and 12 are denoted by the same reference numerals, to omit the description thereof.

Referring to FIG. 13, the stabilizing circuit 12b includes a high-resistance resistive element RR3 having an end which is connected to an output terminal Vo1 and another end which is connected to a second power supply terminal Vee through a current source I23, and a high-resistance resistive element RR4 having an end which is connected to an output terminal Vo2, and another end which is connected to the other end of the resistive element RR3 and coupled to the second power supply terminal Vee through the current source I23.

The operation is now described. When the output terminals Vo1 and Vo2 are at logical high and low levels respectively, transistors T3 and T6 are brought into conducting states and transistors T4 and T5 are brought into OFF states. In this state, a current Ib flows from the output terminal Vo1 to the second power supply terminal Vee through the resistive element RR3 and the current source I23. At this time, a small current flows from the output terminal Vo1 to the output terminal Vo2 through the resistive elements RR3 and RR4, so that this current flows through the pull-down transistor T6. Thus, it is possible to regularly feed a current in the pull-up transistor T3 for preventing the pull-up transistor T3 and the pull-down transistor T5 from entering cutoff states, thereby preventing the output terminal Vo1 from increase in output impedance. While currents flow from the output terminals Vo1 and Vo2 of logical high and low levels through the resistive elements RR3 and RR4, these currents are small and exert no adverse influence on operations for driving the output terminals Vo1 and Vo2 to logical high and low levels in logic transition of the input signals.

In the structure shown in FIG. 13, if the resistive elements RR3 and RR4 are adapted to have sufficiently high resistance values in order to prevent significant large currents from flowing between the output terminals Vo1 and Vo2, it is not necessary to provide the current source I23 in particular. In other words, in this arrangement, the resistive elements RR3 and RR4 may be connected between the output terminals Vo1 and Vo2, and the second power supply terminal Vee respectively.

Also according to the structure shown in FIG. 13, it is possible to implement an effect which is similar to that of the structure shown in FIG. 11 or 12.

Embodiment 13

Figure 14:
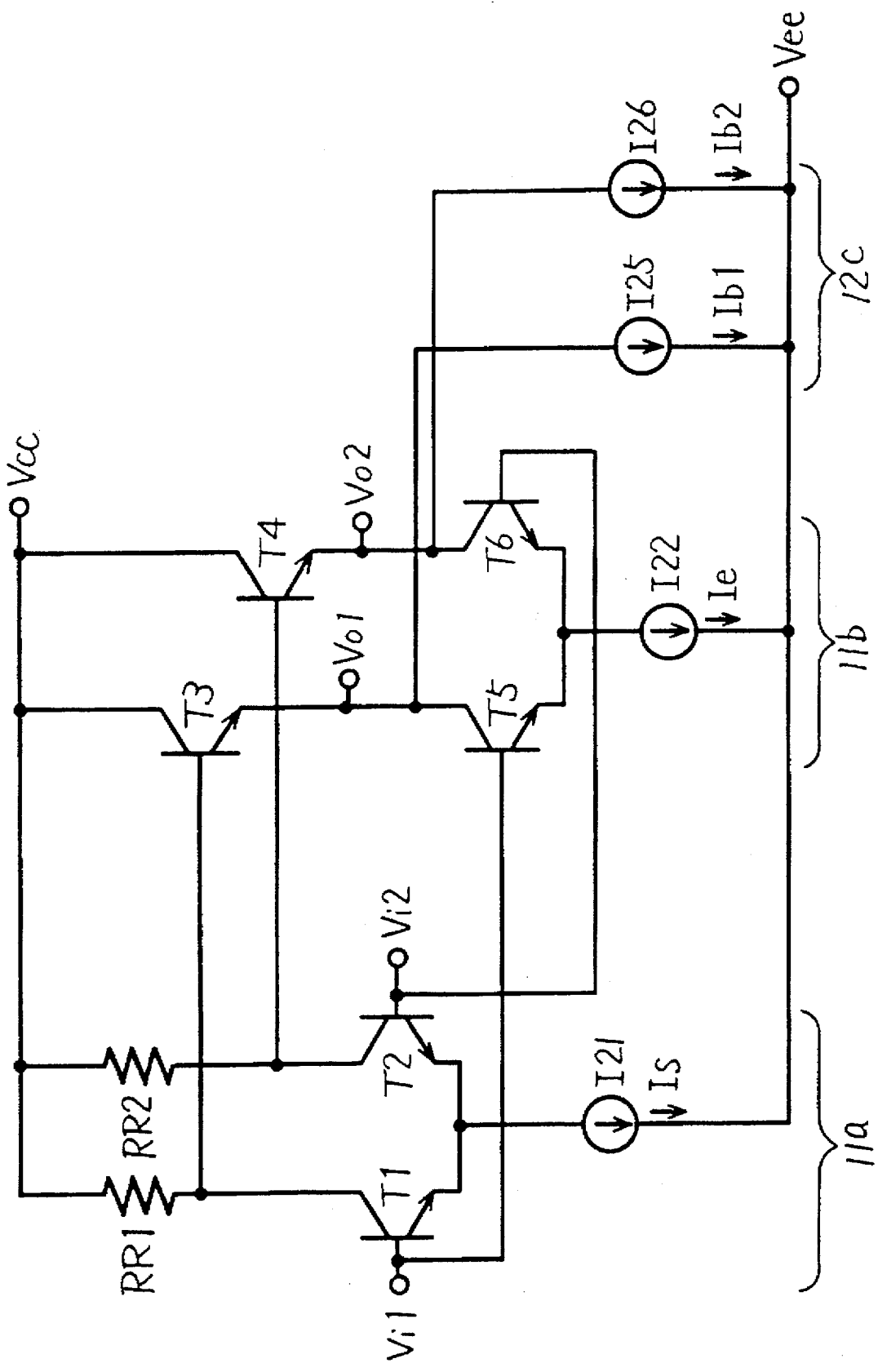
FIG. 14 is a circuit diagram showing the structure of an emitter-coupled logic circuit according to a thirteenth embodiment of the present invention.

FIG. 14 is a circuit diagram showing the structure of an emitter-coupled logic circuit 14 according to a thirteenth embodiment of the present invention. The emitter-coupled logic circuit 14 shown in FIG. 14 has the same structure as that shown in each of FIGS. 11 to 13, except a stabilizing circuit 12c. In the emitter-coupled logic circuit 14 shown in FIG. 14, parts corresponding to those of the emitter-coupled logic circuits shown in Figs. 11 to 13 are denoted by the same reference numerals, to omit the description thereof.

In the emitter-coupled logic circuit 14 shown in FIG. 14, the stabilizing circuit 12c includes current sources I25 and I26 which are connected between output terminals Vo1 and Vo2, and the second power supply terminal Vee respectively. The current sources I25 and I26 supply bias currents Ib1 and Ib2 which are sufficiently smaller than an emitter-follower current Ie flowing through a current source I22. The currents Ib1 and Ib2 supplied by the current sources I25 and I26 are at the minimum necessary values for maintaining pull-up transistors T3 and T4 in conducting states respectively. In the structure shown in FIG. 14, the pull-up transistor T3 or T4 is brought into a conducting state when the output terminal Vo1 or Vo2 is driven to a logical high level. Also when the potential of the output terminal Vo1 is increased to a logical high level, the current Ib1 flows in the pull-up transistor T3 through the current source I25. Thus, the pull-up transistor T3 can be regularly maintained in a conducting state even when the output terminal Vo1 is driven up to a logical high level. Similarly, the pull-up transistor T4 can be regularly maintained in a conducting state by the current source I26, even when the output terminal Vo2 is driven up to a logical high level.

Also when the structure shown in FIG. 14 is employed, it is possible to provide an effect which is similar to those of the structures shown in FIGS. 11 to 13. While the current sources I25 and I26 are employed, the currents Ib1 and Ib2 thereof are extremely small and hence increase in current consumption is extremely small. These current sources I25 and I26 may be replaced by high-resistance resistive elements, as described above with reference to FIG. 13.

Embodiment 14

Figure 15:
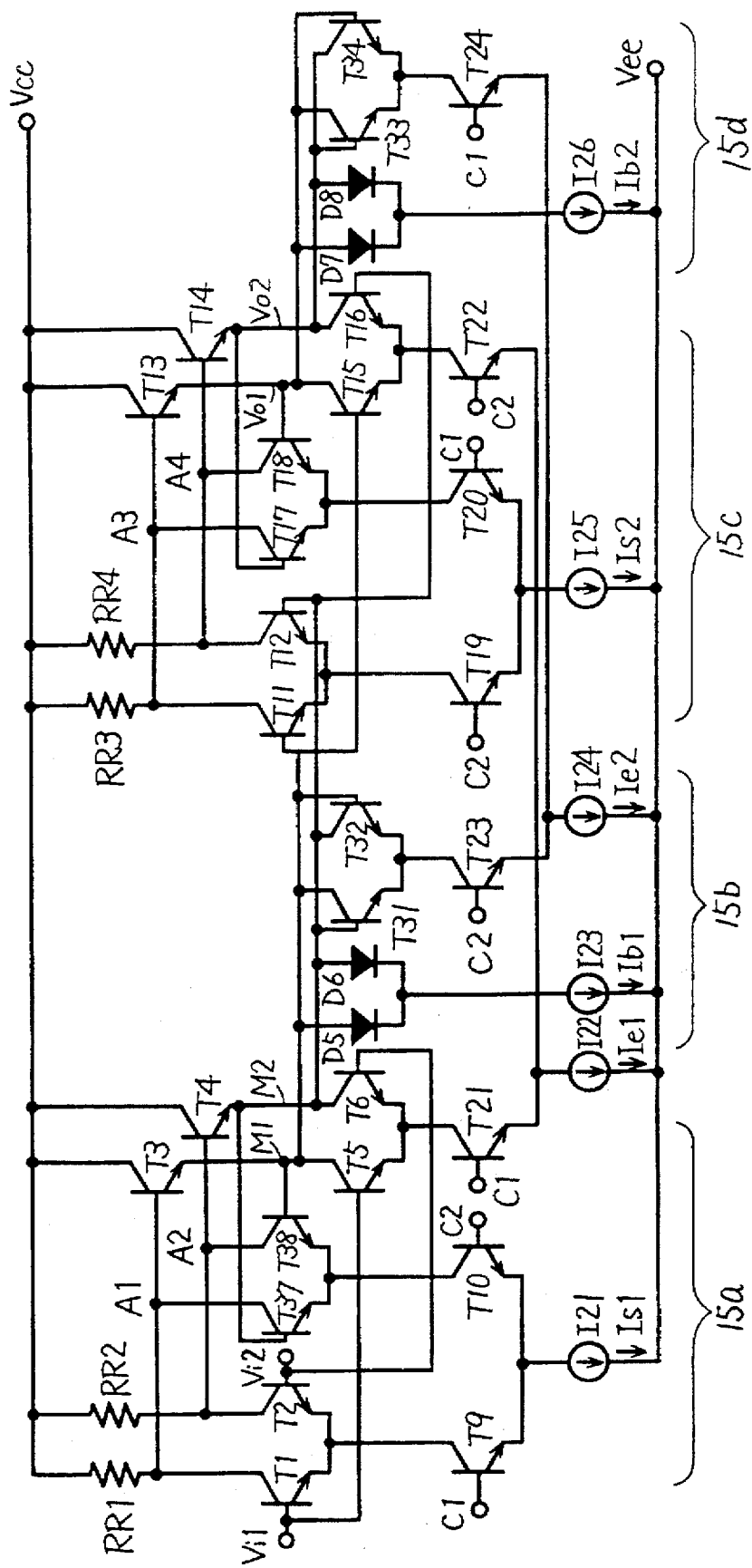
FIG. 15 is a circuit diagram showing the structure of a data latch circuit according to a fourteenth embodiment of the present invention.

FIG. 15 is a circuit diagram showing a data latch circuit 15 according to a fourteenth embodiment of the present invention. The data latch circuit 15 shown in FIG. 15 latches and outputs input signals which are supplied to data input terminals Vi1 and Vi2 in response to two-phase, non-overlapping clock signals C1 and C2.

Referring to FIG. 15, the data latch circuit 15 includes a data hold circuit 15a which incorporates, differentially amplifies complementary logic input signals supplied to the input terminals Vi1 and Vi2 respectively for outputting in response to a clock signal C1 and latches the differentially amplified input signals in response to a clock signal C2, a stabilizing circuit 15b for stably maintaining complementary internal output signals of the data hold circuit 15a, a data hold circuit 15c which operates complementarily to the data hold circuit 15a for latching the complementary internal logic signals outputted from the data hold circuit 15a for outputting, and a stabilizing circuit 15d for stably maintaining complementary output signals of the data hold circuit 15c.

The data hold circuit 15a includes input transistors T1 and T2 for differentially amplifying input signals of complementary logics which are supplied to the input terminals Vi1 and Vi2 in activation or when activated, pull-up transistors T3 and T4 for driving internal output nodes M1 and M2 to a logical high level of a voltage level which is supplied to a first power supply terminal Vcc respectively in response to signals differentially amplified by the input transistors T1 and T2 respectively, output drive transistors (pull-down transistors) T5 and T6 for differentially amplifying the complementary logic signals which are supplied to the input terminals Vi1 and Vi2 in activation and outputting the amplified signals to the internal output nodes M1 and M2 respectively, transistors T7 and T8 forming a latch circuit for holding the signals (those on internal nodes A1 and A2) which are differentially amplified by the transistors T1 and T2 in activation, an activation transistor T9 for activating a differential stage which is formed by the transistors T1 and T2 in response to a clock signal supplied to a clock input terminal C1, an activation transistor T10 for activating a latch stage which is formed by the transistors T7 and T8 in response to a clock signal supplied to a clock input terminal C2, and an activation transistor T21 for activating the output drive transistors (pull-down transistors) T5 and T6 in response to the clock signal supplied to the clock input terminal C1. The input transistor T1 has a base which is connected to the input terminal Vi1, a collector which is connected to a first power supply terminal Vcc through a resistive element RR1, and an emitter which is connected to a collector of the activation transistor T9. The transistor T2 has a base which is connected to the input terminal Vi2, a collector which is connected to the first power supply terminal Vcc through a resistive element RR2, and an emitter which is coupled to that of the input transistor T1 and connected to the collector of the activation transistor T9. The activation transistor T9 has a base which is connected to the clock input terminal C1, and an emitter which is coupled to a second power supply terminal Vee through a current source I21.

The output drive transistor (pull-up transistor) T3 has a base which is connected to the collector of the input transistor T1 through the internal node A1, a collector which is connected to receive the voltage on the first power supply terminal Vcc, and an emitter which is connected to the internal output node M1. The output drive transistor (pull-up transistor) T4 has a base which is connected to the collector of the input transistor T2 through the internal node A2, a collector which is connected to receive the voltage on the first power supply terminal Vcc, and an emitter which is connected to the internal output node M2. The output drive transistor (pull-down transistor) T5 has a base which is connected to the input terminal Vi1, a collector which is connected to the internal output node M1, and an emitter which is connected to the collector of the activation transistor T21. The output drive transistor (pull-down transistor) T6 has a base which is connected to the input terminal Vi2, a collector which is connected to the internal output node M2, and an emitter which is connected to that of the output drive transistor (pull-down transistor) T5 as well as to the collector of the activation transistor T21. The activation transistor T21 has a base which is connected to a clock signal input terminal C1, and an emitter which is coupled to the second power supply terminal Vee through a current source I22.

The latch transistor T7 has a base which is connected to the internal output node M2, a collector which is connected to the internal node A1, and an emitter which is connected to a collector of the activation transistor T10. The latch transistor T8 has a base which is connected to the internal output node M1, a collector which is connected to the internal node A2, and an emitter which is connected to that of the transistor T7 and the collector of the activation transistor T10. The activation transistor T10 has a base which is connected to the clock input terminal C2, and an emitter which is connected to that of the activation transistor T9 and coupled to the second power supply terminal Vee through a current source I21. A switching current Is1 flowing in the differential stage which is formed by the transistors T1 and T2 or in the latch stage which is formed by the transistors T7 and T8 flows through the current source I21.

The stabilizing circuit 15b comprises a latch stage for latching signal potentials on the internal output nodes M1 and M2, and a current control stage for preventing the data hold circuit 15a from increase in output impedance. The latch stage includes transistors T31 and T32 having emitters which are connected together, and an activation transistor T23 for coupling the common emitters of the transistors T31 and T32 to a current source I24 in response to a clock signal supplied to clock input terminal C2. The transistor T31 has a base which is connected to the internal output node M2, a collector which is connected to the internal output node M1, and an emitter which is connected to a collector of the activation transistor T23. The transistor T32 has a base which is connected to the internal output node M1, a collector which is connected to the internal output node M2, and an emitter which is connected to the collector of the activation transistor T23. The activation transistor T23 has an emitter which is coupled to the second power supply terminal Vee through a current source I24.

The current control stage includes a diode D5 having an anode which is connected to the internal output node M1 and a cathode which is coupled to the second power supply terminal Vee through a current source I23, and a diode D6 having an anode which is connected to the internal output node M2, and a cathode which is connected to that of the diode D5 and coupled to the second power supply terminal Vcc through the current source I23. A current Ib1 flowing through the current source I23 is sufficiently smaller than a current (emitter-follower current) Ie1 flowing through the current source I22.

The data hold circuit 15c has a structure which is similar to that of the data hold circuit 15a. Namely, the data hold circuit 15c includes a differential stage which is activated in response to a clock signal supplied to a clock input terminal C2 for differentially amplifying the signals on the internal output nodes M1 and M2 respectively. This differential stage includes a differential transistor T11 having a base which is connected to the internal output node M1, a collector which is connected to the first power supply terminal Vcc through a resistive element RR3, and an emitter which is connected to a collector of an activation transistor T19, a differential transistor T12 having a base which is connected to the internal output node M2, a collector which is connected to the first power supply terminal Vcc through a resistive element RR4, and an emitter which is connected to that of the transistor T11 and to the collector of the activation transistor T19, and the activation transistor T19 which conducts in response to the clock signal supplied to the clock input terminal C2 for coupling the common emitters of the transistors T11 and T12 to a current source I25.

The data hold circuit 15c further includes output drive transistors (pull-up transistors) T13 and T14 for driving the output terminals Vo1 and Vo2 to a logical high level of a voltage level on the first power supply terminal Vcc in response to signal potentials appearing on the internal nodes A3 and A4 which are differentially amplified by the differential stage, a latch stage which is activated in response to the clock signal supplied to the clock input terminal C1 for latching the signal potentials on the internal nodes A3 and A4, and an output drive stage (pull-down stage) which operates complementarily to the pull-up transistors T13 and T14 for driving the output terminals Vo1 and Vo2 to voltage levels of logical low levels by an emitter-follower current in response to signals on the internal output nodes M1 and M2.

The output drive transistor (pull-up transistor) T13 has a base which is connected to the collector of the transistor T11 through the internal node A3, a collector which is connected to receive the voltage on the first power supply terminal Vcc, and an emitter which is connected to the output terminal Vo1. The output drive transistor (pull-up transistor) T14 has a base which is connected to the collector of the transistor T12 through the internal node A4, a collector which is connected to receive the voltage on the first power supply terminal Vcc, and an emitter which is connected to the output terminal Vo2.

The latch stage includes transistors T17, T18 and T20 and the current source I25. The transistor T17 has a base which is connected to the output terminal Vo2, a collector which is connected to the internal node A3, and an emitter which is connected to a collector of the activation transistor T20. The transistor T18 has a base which is connected to the output terminal Vo1, a collector which is connected to the internal node A4, and an emitter which is connected to that of the transistor T17 and to the collector of the activation transistor T20. The activation transistor T20 has a base which is connected to the clock input terminal C1, and an emitter which is connected to that of the transistor T19 and coupled to the second power supply terminal Vee through the current source I25.

The output drive stage (pull-down stage) includes an output drive transistor (pull-down transistor) T15 having a base which is connected to the internal output node M1, a collector which is connected to the output terminal Vo1, and an emitter which is connected to a collector of an activation transistor T22, an output drive transistor (pull-down transistor) T16 having a base which is connected to the internal output node M2, a collector which is connected to the output terminal Vo2, and an emitter which is connected to the transistor T15 and the collector of the activation transistor T22, and the activation transistor T22 having a base which is connected to a clock input terminal C2, and an emitter which is connected to that of the activation transistor T21 included in the data hold circuit 15a as well as to the second power supply terminal Vee through a current source I22.

The stabilizing circuit 15d includes a latch stage for holding the signal potentials on the output terminals Vo1 and Vo2, and a current control stage for preventing output impedances for the output terminals Vo1 and Vo2 from being increased. The latch stage includes a latch transistor T33 having a base which is connected to the output terminal Vo2, a collector which is connected to the output terminal Vo1, and an emitter which is connected to a collector of an activation transistor T24, and a latch transistor T34 having a base which is connected to the output terminal Vo1, a collector which is connected to the output terminal Vo2, and an emitter which is connected to that of the latch transistor T33 and to the collector of the activation transistor T20. The activation transistor T24 has a base which is connected to a clock input terminal C1, and an emitter which is connected to that of the activation transistor T23 included in the stabilizing circuit 15b and coupled to the second power supply terminal Vee through the current source I24.

The output current control stage includes a diode D7 having an anode which is connected to the output terminal Vo1, and a cathode which is coupled to the second power supply terminal Vee through a current source I26, and a diode D8 having an anode which is connected to the output terminal Vo2, and a cathode which is connected to that of the diode D7 and coupled to the second power supply terminal Vee through the current source I26.

In the structure shown in FIG. 15, all employed transistors are NPN bipolar transistors, and the employed diodes are PN diodes. The current source I26 is smaller in current driving capability than the current sources I24 and I22.

The operation is now described. When clock signals which are supplied to the clock signal terminals C1 are at logical high levels of active states, those supplied to the clock input terminals C2 are at logical low levels of inactive states. In this state, the activation transistors T9, T21, T20 and T24 are brought into conducting states, while the activation transistors T10, T19, T23 and T22 are brought into cutoff states. Namely, the differential stage which is formed by the input transistors T1 and T2, the output drive stage which is formed by the transistors T5 and T6, and the latch stage which is formed by the transistors T17 and T18, and the latch stage which is formed by the transistors T33 and T34 are activated. In the data hold circuit 15a, complementary logic signals which are supplied to the input terminals Vi1 and Vi2 are differentially amplified by the transistors T1 and T2 so that the differentially amplified signals are outputted on the internal nodes A1 and A2. In response to the signal potentials on the internal nodes A1 and A2, one of the pull-up transistors (output drive transistors) T3 and T4 is brought into a conducting state and the other one is brought into a cutoff state respectively. Similarly, one of the transistors T5 and T6 enters a conducting state and the other one enters a cutoff state in response to the complementary logic signals which are supplied to the input terminals Vi1 and Vi2 respectively. When the logic signal which is supplied to the input terminal Vi1 is at a logical high level, the signal potentials on the internal nodes A1 and A2 are at logical low and high levels respectively, and the output drive transistors (pull-up transistors) T3 and T4 are brought into a cutoff state and a conducting state respectively. The output drive transistors (pull-down transistors) T5 and T6 are brought into a conducting state and a cutoff state respectively. Thus, the internal output node M1 is discharged by the emitter-follower current Ie1 flowing through the transistors T5 and T21 and the current source I22, to be changed to a logical low level. On the other hand, the internal output node M2 is charged through the output drive transistor (pull-up transistor) T4, to be changed to a logical high level. Also when the internal output node M2 is driven to a logical high level, the diodes D6 and D5 are brought into a conducting state and a cutoff state respectively and the small current Ib1 flows through the output drive transistor (pull-up transistor: hereinafter simply referred to as an output drive transistor) T4 by the current source I23, whereby the output drive transistor T4 is regularly and reliably maintained in a conducting state. The current Ib1 flowing through the current source I23 is at the minimum necessary value for maintaining the output drive transistor T4 in the conducting state. Due to a series of such operations, the signals of logics corresponding to the complementary logic signals which are supplied to the input terminals Vi1 and Vi2 are stably outputted to the internal output nodes M1 and M2 respectively.

In the data hold circuit 15c, on the other hand, the latch stage (the transistors T17, T18 and T20) is activated and the differential stage at its input part is inactivated. In this state, the transistors T11 and T12 carry out no differential amplifying operations, and the complementary logic signals appearing on the internal output nodes M1 and M2 are not transmitted. It is assumed here that the output terminals Vo1 and Vo2 are at logical high and low levels respectively. In this state, the output drive transistor T13 is in a conducting state and the potential of the internal node A3 is at a logical high level, while the output transistor T14 is in a cutoff state and the potential of the internal node A4 is at a logical low level. In the latch stage, the transistors T17 and T18 are brought into a cutoff state and a conducting state respectively, while the potential on the internal node A4 is maintained at the logical low level by the transistor T18, the activation transistor T20 and the current source I25. The internal node A3 is maintained at the logical high level by the resistive element RR3, since the transistor T17 is in a cutoff state.

In the stabilizing circuit 15d, the transistors T34 and T33 are brought into a conducting state and a cutoff state respectively, and the output terminal Vo2 is maintained at a logical low level by an emitter-follower current Ie2 flowing through the transistors T34 and T24 and the current source I24. On the other hand, the transistor T33 is in the cutoff state and the output terminal Vo1 is maintained at a logical high level by the output drive transistor T13. The transistors T33 and T34 are so provided as to form paths for feeding the emitter-follower currents as to the output terminals Vo1 and Vo2 in inactivation of the transistors T15 and T16 of the output drive stage, thereby stably maintaining the potentials at the output terminals Vo1 and Vo2. When the output terminal Vo1 is at a potential of a logical high level, the diodes D7 and D8 enter a conducting state and a cutoff state respectively, to cause a flow of a small current Ib2 supplied from the current source I26 in the output drive transistor T13 which is in a conducting state. Thus, the output drive transistor T13 is prevented from entering a cutoff state due to potential increase at the output terminal Vo1.

When the clock signals supplied to the clock input terminals C1 and C2 are brought into inactive states of logical low levels and active states of logical high levels respectively, the differential amplification and latch operations in the data hold circuits 15a and 15c are switched, while active/inactive states of latch operations are switched in the stabilizing circuits 15b and 15d. Namely, the transistors T7 and T8 latch the signal potentials of the internal nodes A1 and A2 in the data hold circuit 15a. In the stabilizing circuit 15b, the transistors T31 and T32 latch the signal potentials of the internal output nodes M1 and M2. At this time, the diodes D5 and D6 maintain the functional operation for causing a flow of a small current in one of the internal output nodes M1 and M2.

In the data hold circuit 15c, the transistors T11 and T12 carry out differential amplifying operations for differentially amplifying the internal signals of complementary logics appearing on the internal output nodes M1 and M2 and transmitting the amplified signals to the internal nodes A3 and A4. The latch stage (the transistors T17 and T18) is in an inactive state, and conducting/cutoff states of the output drive transistors T13 and T14 are decided in response to the signal potentials which are newly transmitted to the internal nodes A3 and A4. Similarly, one of the output drive transistors T15 and T16 is brought into a conducting state and the other one is brought into a cutoff state in response to the complementary logic signals on the internal output nodes M1 and M2 respectively. One of the output drive transistors T13 and T15 is brought into a conducting state and the other one is brought into a cutoff state, while one of the output drive transistors T14 and T16 is brought into a conducting state and the other one is brought into a cutoff state. In the stabilizing circuit 15d, the latch stage (the transistors T33 and T34) is inactivated. In this state, the diodes D7 and D8 stabilize the outputs. More specifically, one of the diodes D7 and D8 is brought into a conducting state in response to the complementary logic output signals newly appearing on the output terminals Vo1 and Vo2, to cause a flow of a small current in one of the output drive transistors entering a conducting state.

As hereinabove described, it is possible to regularly and stably feed the emitter-follower currents to the internal output nodes M1 and M2 for stably maintaining the signal potentials on the internal output nodes M1 and M2 by complementarily activating the output drive stage which is formed by the output drive transistors T5 and T6 and the latch stage which is formed by the latch transistors T31 and T32. Further, it is possible to regularly cause a flow of a current in the output drive transistor T3 or T4 to be brought into a conducting state by providing the diodes D5 and D6 and the current source I23, thereby preventing the outputs from entering high impedance states. This also applies to the data hold circuit 15c and the stabilizing circuit 15d.

The circuit 15 shown in FIG. 15 and having a data hold function is basically identical to the emitter-coupled logic circuit 12 shown in FIG. 12, and can implement the effects which are similar to those of the circuits shown in FIGS. 12 to 14. In particular, it is possible to sufficiently increase the amplitudes of the differential signals which are supplied to the output drive transistors T15 and T16 by directly driving the output drive stage with the complementary logic signals which are supplied to the input terminals Vi1 and Vi2 and by directly driving the output drive transistors T15 and T16 with the signals on the complementary internal output nodes M1 and M2, thereby implementing data hold circuits stably operating at high speeds. The signal potentials of the internal output nodes M1 and M2 and the output terminals Vo1 and Vo2 are stabilized by the diodes D5 to D8, whereby the outputs can be stabilized by a simple circuit structure. The structure which is formed by the diodes D5 and D6 and the current source I23 or the diodes D7 and D8 and the current source I26 may alternatively be replaced by the structure shown in any of FIGS. 12 to 14.

Embodiment 15

Figure 16:
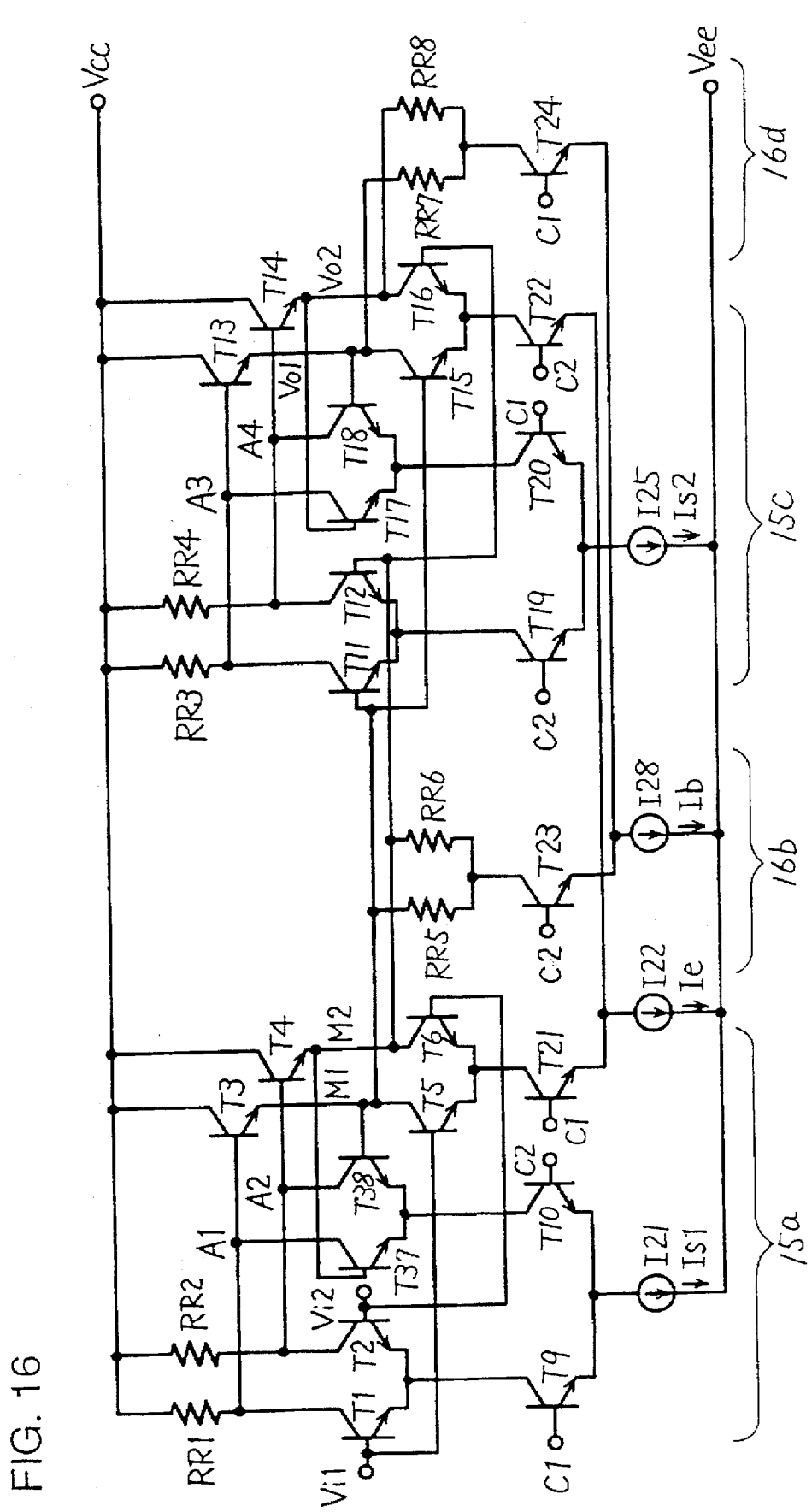
FIG. 16 is a circuit diagram showing the structure of a data latch circuit according to a fifteenth embodiment of the present invention.
Figure 17:
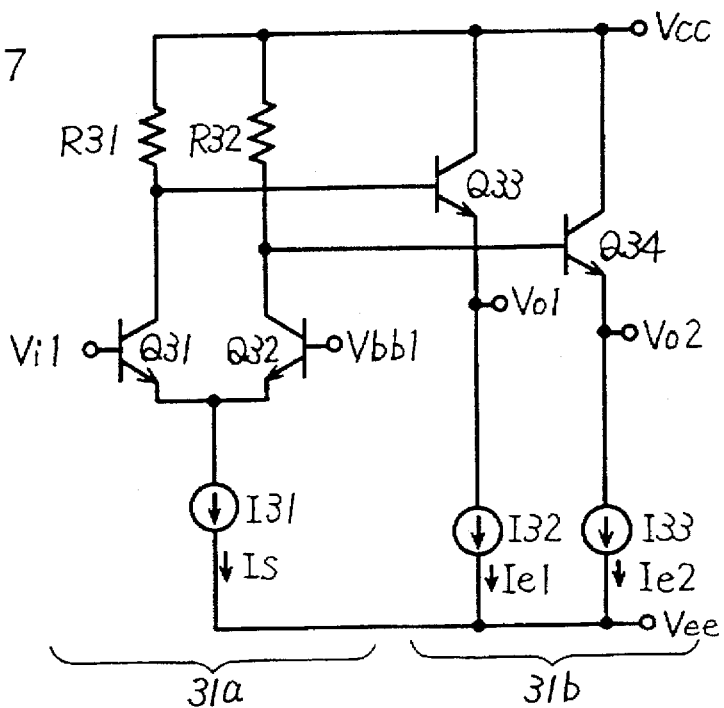
FIG. 17 is a circuit diagram showing the structure of a conventional emitter-coupled logic circuit 31.
Figure 18:
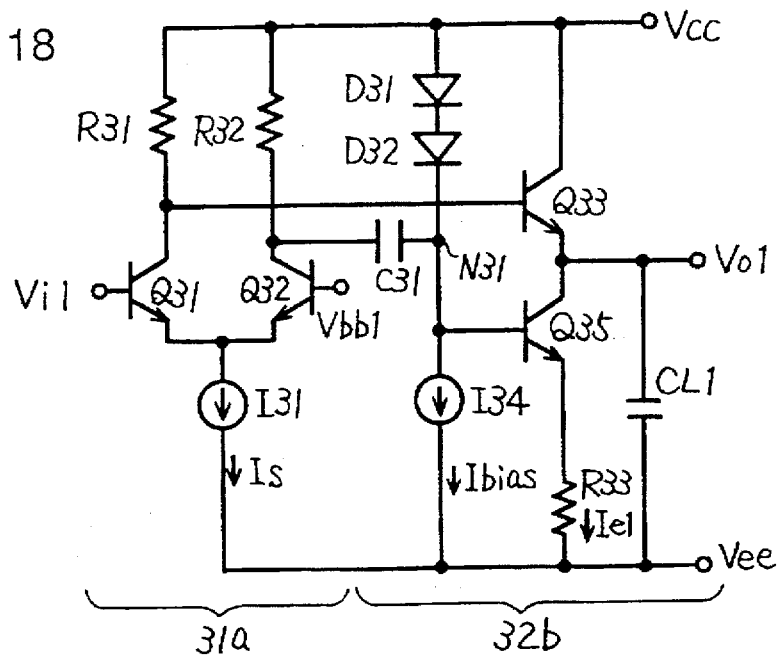
FIG. 18 is a circuit diagram showing the structure of another conventional emitter-coupled logic circuit 32.
Figure 19:
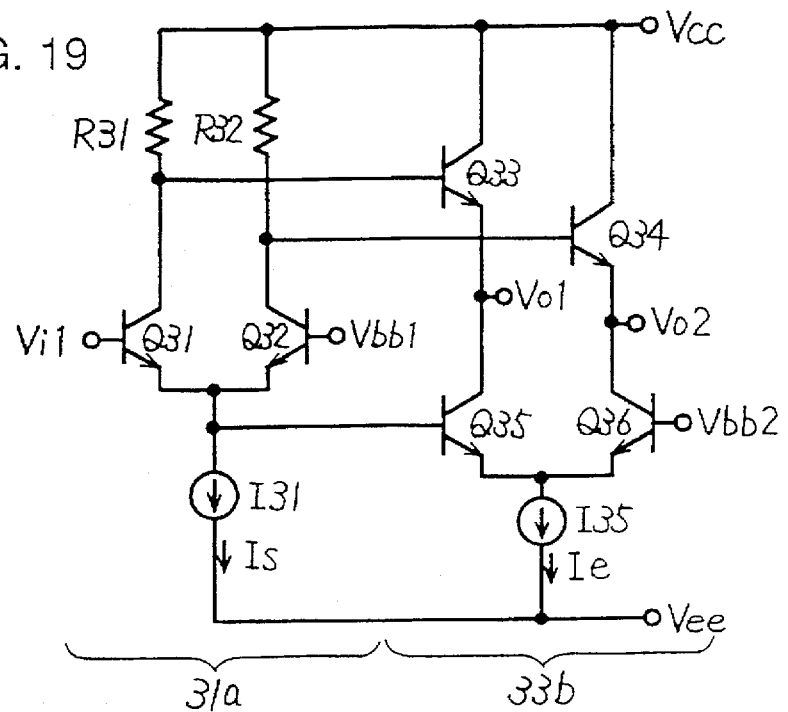
FIG. 19 is a circuit diagram showing the structure of still another conventional emitter-coupled logic circuit 33.
Figure 20:
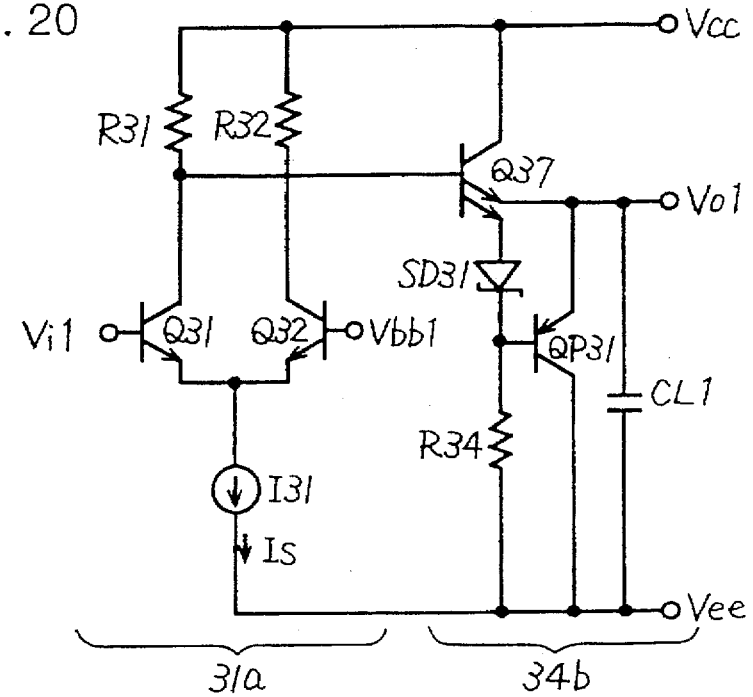
FIG. 20 is a circuit diagram showing the structure of a further conventional emitter-coupled logic circuit 34.

FIG. 16 is a circuit diagram showing the structure of a data latch circuit 16 utilizing an emitter-coupled logic circuit according to a fifteenth embodiment of the present invention. The data latch circuit 16 is identical in structure to the data latch circuit 15 shown in FIG. 15, except the structures of stabilizing circuits 16b and 16d. Data hold circuits 15a and 15c of the data latch circuit 16 are identical in structure to those shown in FIG. 15, and corresponding parts are denoted by the same reference numerals, to omit the description thereof.

The stabilizing circuit 16b for stabilizing and holding signal potentials on internal output nodes M1 and M2 includes a resistive element RR5 having an end which is connected to the internal output node M1, a resistive element RR6 having an end which is connected to the internal output node M2 and another end which is connected to that of the resistive element RR5, and an activation transistor T23 having a base which is connected to a clock signal input terminal C2, a collector which is connected to the other ends of the resistive elements RR5 and RR6, and an emitter which is connected to a second power supply terminal Vee through a current source I28. The current source I28 has current driving capability which is substantially identical to that of a current source I22.

The stabilizing circuit 16d includes a resistive element RR7 having an end which is connected to an output terminal Vo1, a resistive element RR8 having an end which is connected to an output terminal Vo2 and another end which is connected to that of the resistive element RR7, and an activation transistor T24 having a base which is connected to a clock input terminal C1, a collector which is connected to the other ends of the resistive elements RR7 and RR8, and an emitter which is coupled to the second power supply terminal Vee through the current source I28.

The activation transistors T23 and T24 are formed by NPN bipolar transistors, and brought into operating states when signals supplied to the bases thereof are at logical high levels.

The operation is now described on the stabilizing circuits 16b and 16d. The data hold circuits 15a and 15c are identical in operation to those shown in FIG. 15.

When a clock signal which is supplied to the clock input terminal C1 is at a logical high level, one of transistors T5 and T6 enters a conducting state and the other one enters a cutoff state in response to complementary logic signals which are supplied to the signal input terminals Vi1 and Vi2. Further, one of output drive transistors T3 and T4 enters a conducting state and the other one enters a cutoff state in response to differentially amplified signals (potentials of nodes A1 and A2) of transistors T1 and T2. Thus, one of the internal output nodes M1 and M2 is changed to a logical high level, while the other one is changed to a logical low level. Assume that the output drive transistors T3 and T4 are in a conducting state and a cutoff state respectively. In this case, the pull-down transistors T5 and T6 are in a cutoff state and a conducting state respectively. The internal output node M1 is charged through the output drive transistor T3, so that its potential is changed to a logical high level. On the other hand, the internal output node M2 is discharged by the transistors T6 and T21 and the current source I22, so that its potential is changed to a logical low level. In the stabilizing circuit 16b, the activation transistor T23 is in a cutoff state. In this state, the potentials of the internal output nodes M1 and M2 are at high and logical low levels respectively. Since the resistive elements RR5 and RR6 are connected in series between the internal output nodes M1 and M2, a current from the output drive transistor T3 flows through the transistors T6 and T21 which are in conducting states and the current source I22 through the resistive elements RR5 and RR6. The resistive elements RR5 and RR6 are adapted to have sufficiently high resistance values, and a current flowing from the internal output node M1 to the internal output node M2 through the resistive elements RR5 and RR6 is small. Thus, a current regularly flows in the output drive transistor T3 which is in a conducting state, whereby the transistor T3 can be regularly and reliably maintained in the conducting state. Due to the small current which is supplied from the transistor T3 to the internal output node M2 through the resistive elements RR5 and RR6, a current flowing through the output drive transistor T4 is reduced, whereby an emitter-follower current Ie flowing through the current source I22 is maintained at a constant value. The output drive transistor T4 supplies a current also in a cutoff state (because it is not completely in a non-conducting state).

When the clock signal which is supplied to the clock input terminal C1 is changed to a logical low level and the activation transistor T21 enters a cutoff state, the clock signal which is supplied to the clock input terminal C2 is changed to a logical high level and the activation transistor T23 is brought into a conducting state. In this state, the resistive elements RR5 and RR6 are connected to the current source I28 in common. A current Ib having a small value flows through the current source I28. In this state, no current flows to the transistors T5 and T6 (the activation transistor T21 is in a non-conducting state). Therefore, currents which are decided by potentials of the internal output nodes M1 and M2 flow to the resistive elements RR5 and RR6. Assuming that VH represents a logical high level voltage of the internal output node M1, VL represents a logical low level voltage of the internal output node M2 and R represents resistance values of the resistive elements RR5 and RR6, the currents through the resistive elements RR5 and RR6 are expressed as follows:

RR5; $\{Ib+(VH-VL)/R\}/2$

RR6; $\{Ib-(VH-VL)/R\}/2$

Small currents regularly flow through the output drive transistors T3 and T4, whereby the output drive transistor to be brought into a conducting state can be regularly maintained in the conducting state. At this time, the currents flowing through the resistive elements RR5 and RR6 are decided in accordance with to the signal potentials of the internal output nodes M1 and M2, whereby potential difference between the output nodes M1 and M2 is not reduced and it is possible to stably maintain the signal potentials of the output nodes M1 and M2. Here, in an ECL circuit inputting and outputting an ECL level signal, an output drive transistor (pull-up transistor) is not completely turned off even when a logical low signal is outputted, different from CMOS circuit processing an MOS level signal.

The stabilizing circuit 16d carries out an operation which is identical to that of the stabilizing circuit 16b. The operating state of the stabilizing circuit 16d, whose operating mode is decided in response to the clock signal supplied to the clock input terminal C1, is complementary to that of the stabilizing circuit 16b. The current source 128 is alternately utilized by the stabilizing circuits 16b and 16d, whereby it is possible to implement a latch circuit which stably incorporates, latches and outputs complementary logic signals in a simple circuit structure with low current consumption. The current source 122 is alternately utilized by the data hold circuits 15a and 15c. Since the data hold circuits 15a and 15c are alternately activated so that only one of these circuits utilizes the current source, it is possible to reduce current consumption.

Also in the structure shown in FIG. 16, it is possible to implement an effect which is similar to that of the fourteenth embodiment shown in FIG. 15.

Modifications

In each of the aforementioned structures shown in FIGS. 1 to 16, only NPN bipolar transistors are employed and the current flows from the first power supply terminal Vcc to the second power supply terminal Vee. When the potential of the first power supply terminal Vcc is lower than that of the second power supply terminal Vee, it is possible to implement a similar operation by employing PNP bipolar transistors in place of the NPN bipolar transistors in every one of the aforementioned embodiments. The anodes and the cathodes are replaced with each other in the diodes.

While the bipolar transistors are employed in every one of the aforementioned embodiments, it is possible to implement a similar effect by alternatively employing insulated gate type field-effect transistors such as MOS transistors, or transistors such as MESFETs (metal-semiconductor field-effect transistors) which are made of, e.g., gallium arsenide. When insulated gate type field-effect transistors (IGFETs) are employed, a source-coupled logic circuit or a current mode logic circuit is implemented. Such emitter-coupled, source-coupled and current mode logic circuits are generically called current switching logic circuits in the present application.

In the one-stage logic circuit, the logic signals which are supplied to the input terminals Vi1 and Vi2 are inverted in logic and transmitted to the output terminals Vo1 and Vo2. Alternatively, when a signal of a logical high level is inputted in the input terminal Vi1, for example, the output terminal Vo1 may output a logical high level. In this case, the circuit is formed to have a buffer function. Namely, the circuit may be so formed that the output terminal Vo1 outputs a signal of a logical high level when the input terminal Vi1 is supplied with a logical high level signal.

According to the present invention, as hereinabove described, the emitter-follower current is reduced when the output signal is changed from a logical low level to a logical high level with respect to one output terminal, and is increased when the output signal is changed from a logical high level to a logical low level, whereby load drivability is improved and it is possible to reduce the emitter-follower current, thereby reducing power consumption. Further, the base potential amplitudes of the pull-down transistors are substantially identical to the logic amplitudes of the input signals, whereby the circuit operates stably. In addition, the circuit can be formed by only transistors of the same conductivity type and resistances with no requirement for special elements such as a capacitive element for capacitive coupling, a PNP transistor and a Schottky diode, whereby the wafer process is not complicated and the manufacturing cost is not increased. Further, it is possible to readily obtain complementary output signals. In addition, it is possible to prevent the outputs from being unstabilized by increase in output impedance due to provision of the output current control stage.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A current switching logic circuit including first and second power source nodes supplying one and another operation power supply voltages respectively, comprising:

a pair of input nodes supplied with signals of complementary logics;

a first current source coupled to said second power source node;

a first differential stage for differentially amplifying said signals supplied to said pair of input nodes and outputting complementary logic signals to first and second internal intermediate nodes;

a first activation transistor, for coupling said first differential stage to said first current source to activate said first differential stage in response to a first clock signal;

a first output drive transistor coupled between a first internal output node and said first power source node for conducting in response to said signal on said first internal intermediate node to drive said first internal output node to a first logical level;

a second output drive transistor coupled between a second internal output node and said first power source node for conducting complementarily to said first output drive transistor in response to said signal on said second internal intermediate node to drive said second internal output node to said first logical level;

first latch means for holding potentials of said first and second internal intermediate nodes in accordance with potentials on said first and second internal output nodes when activated;

a second activation transistor conducting in response to a second clock signal being opposite in phase to said first clock signal for coupling said first latch means and said first current source with each other to activate said first latch means;

a second current source coupled to said second power source node;

a second differential stage including a pair of transistors having control nodes receiving said pair of input signals respectively for conducting complementarily to said first and second output drive transistors respectively, one-side conduction nodes connected together, and another-side conduction nodes coupled to said first and second internal output nodes respectively;

a third activation transistor for coupling said one-side conduction nodes of said pair of transistors of said second differential stage to said second current source to activate said second differential stage in response to said first clock signal;

a third current source coupled to said second power source;

second latch means activated in response to said second clock signal for holding potentials of said first and second internal output nodes;

a fourth activation transistor for coupling said second clock signal for holding potentials of said first and second internal output nodes;

a third differential stage for differentially amplifying signals on said first and second internal output nodes for outputting to third and fourth internal intermediate nodes when activated;

a fourth current source coupled to said second power source;

a fifth activation transistor conducting in response to said second clock signal for coupling said third differential stage to said fourth current source to activate said third differential stage;

a third output drive transistor for driving a first output node to said first logical level in response to a signal on said third internal intermediate node;

a fourth output drive transistor conducting complementarily to said third output drive transistor in response to a signal potential on said fourth internal intermediate node for driving a second output node to said first logical level;

third latch means for latching potentials on said third and fourth internal intermediate nodes in response to said signal potentials on said first and second output nodes when activated;

a sixth activation transistor for coupling said third latch means to said fourth current source to activate said third latch means in response to said first clock signal;

a fourth differential stage including a pair of transistors having control electrode nodes receiving said signals on said first and second internal output nodes for conducting complementarily to said third and fourth output drive transistors respectively, one-side conduction nodes connected together, and other-side conduction nodes connected to said first and second output nodes respectively;

a seventh activation transistor for coupling said one-side conduction nodes of said pair of transistors of said fourth differential stage to said second current source to activate said fourth differential stage in response to said second clock signal; and fourth latch means activated in response to said first clock signal for latching signals on said first and second output nodes.

2. A current switching logic circuit in accordance with claim 1, wherein said second latch means comprises:

a first latch transistor having a control electrode node connected to said first internal output node, a one-side conduction node, and another-side conduction node connected to said second internal output node, a second latch transistor having a control electrode being connected to said second internal output node, a one-side conduction node connected to that of said first latch transistor, and another-side conduction node connected to said first internal output node, and said fourth activation transistor conducting in response to said second clock signal for coupling said one-side conduction nodes of said first and second latch transistors to said third current source, and said third latch means comprises:

a third latch transistor having a control electrode node connected to said first output node, a one-side conducting node, and another-side conduction node connected to said fourth internal intermediate node, and a fourth latch transistor having a control electrode connected to said second output node, a one-side conduction node connected to that of said third latch transistor, and another-side conduction node connected to said third internal intermediate node, said sixth activation transistor conducting in response to said first clock signal for coupling said one-side conduction nodes of said third and fourth latch transistors to said fourth current source.

3. A current switching logic circuit in accordance with claim 1, wherein said second latch means comprises:

a first resistive element having one end connected to said first internal output node, and another end, a second resistive element having one end connected to said second internal output node, and another end connected to the other end of said first resistive element, said third latch means comprises:

a third resistive element having one end connected to said first output node, and another end, a fourth resistive element having one end connected to said second output node, and another end connected to the other end of said third resistive element.

4. A current switching logic circuit in accordance with claim 1, further comprising:

first current control means having a current driving capability smaller than that of said second current source and coupled between said first and second internal output nodes and said second power source, and second current control means having a current driving capability smaller than that of said second current source, and coupled between said first and second output nodes and said second power source.

5. A current switching logic circuit in accordance with claim 4, wherein said first current control means includes means for causing a flow of a current in one of said first and second output drive transistors being brought into a conducting state, and said second current control means including means for causing a flow of a current in one of said third and fourth output drive transistors being brought into a conducting state.

* * * * *